(12) United States Patent
Carlson et al.

(10) Patent No.: US 9,905,099 B2
(45) Date of Patent: Feb. 27, 2018

(54) MAGNETIC FIELD SENSOR FOR USE IN A SECURITY ALARM SYSTEM

(71) Applicant: 1010210 B.C. Ltd., Surrey (CA)

(72) Inventors: Julian Paul Carlson, Surrey (CA); Dean David Schebel, Port Coquitlam (CA)

(73) Assignee: 1010210 B.C. Ltd., Surrey (CA)

( * ) Notice: Subject to any disclaimer, the term of this patent is extended or adjusted under 35 U.S.C. 154(b) by 0 days.

(21) Appl. No.: 15/329,233

(22) PCT Filed: Jul. 27, 2015

(86) PCT No.: PCT/CA2015/050711
§ 371 (c)(1),
(2) Date: Jan. 25, 2017

(87) PCT Pub. No.: WO2016/011564
PCT Pub. Date: Jan. 28, 2016

(65) Prior Publication Data
US 2017/0228992 A1    Aug. 10, 2017

Related U.S. Application Data

(63) Continuation of application No. 14/341,710, filed on Jul. 25, 2014.

(60) Provisional application No. 62/140,439, filed on Mar. 30, 2015.

(51) Int. Cl.
*G08B 13/24* (2006.01)
*G01V 3/08* (2006.01)
*G08B 3/10* (2006.01)
*G08B 5/36* (2006.01)
*G08B 6/00* (2006.01)

(52) U.S. Cl.
CPC ............. *G08B 13/24* (2013.01); *G01V 3/081* (2013.01); *G08B 3/10* (2013.01); *G08B 5/36* (2013.01); *G08B 6/00* (2013.01)

(58) Field of Classification Search
CPC ................................... A61B 1/00; A61N 1/00
See application file for complete search history.

(56) References Cited

U.S. PATENT DOCUMENTS

| | | | |
|---|---|---|---|
| 4,954,812 A * | 9/1990 | Lebron | G01R 33/07 324/260 |
| 2005/0024207 A1* | 2/2005 | Schebel | G08B 13/08 340/545.2 |

* cited by examiner

*Primary Examiner* — Shirley Lu
(74) *Attorney, Agent, or Firm* — Cameron IP

(57) ABSTRACT

A proximity sensor comprises a magnet which generates a magnetic field and a magnetic field sensor. The magnetic field sensor includes a radio and an antenna which can transmit an output signal on a plurality of output frequencies. A microprocessor is programmed with a plurality of data protocols. Each of the output frequencies operates on at least one of the data protocols. There is a dip switch which is actuated to provide a code to the microprocessor. A data protocol is implemented by the microprocessor based on the code. There is a MEMS oscillator programmed to a discrete frequency based on the data protocol implemented by the microprocessor. The MEMS oscillator provides the discrete frequency to the radio. The radio is provided with single phase-locked loop which generates the output signal based on the discrete frequency. The single phase-locked loop may be a ×32 multiplier.

11 Claims, 28 Drawing Sheets

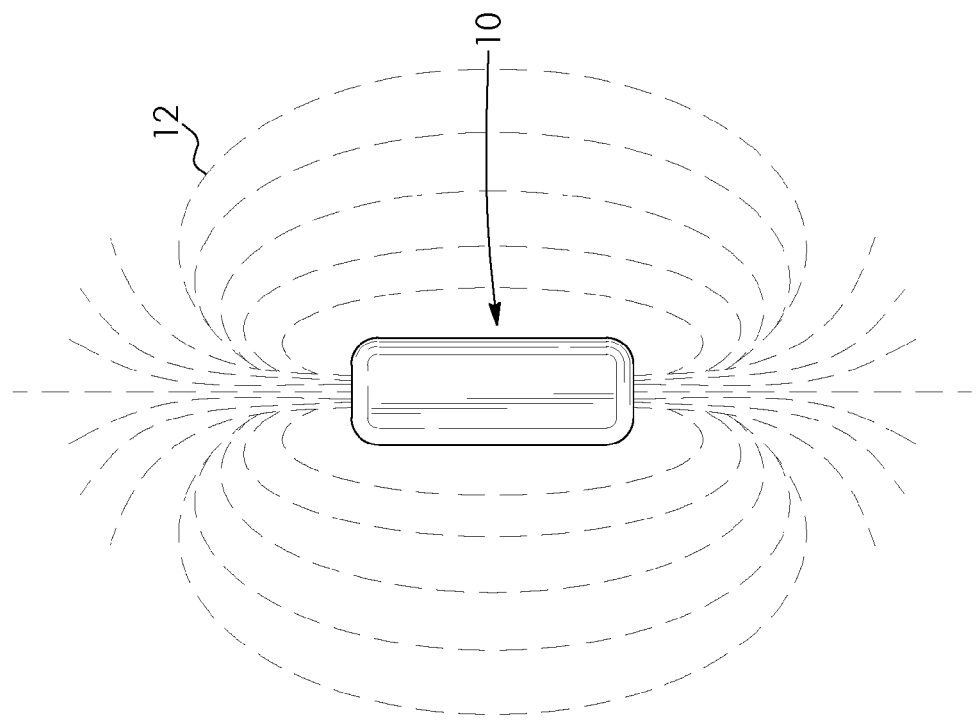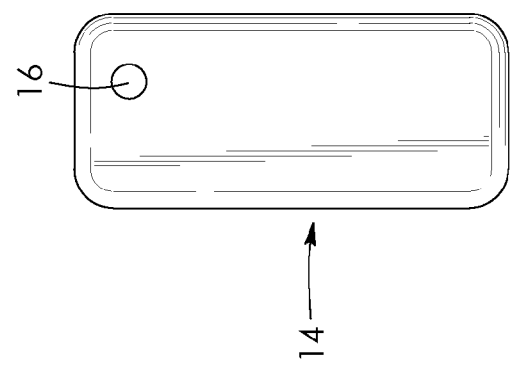
FIG. 3

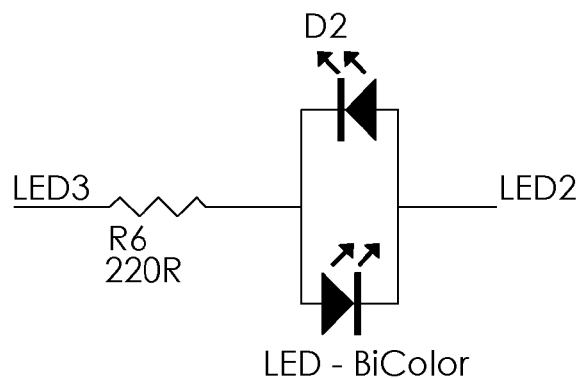
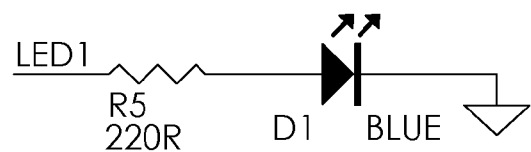
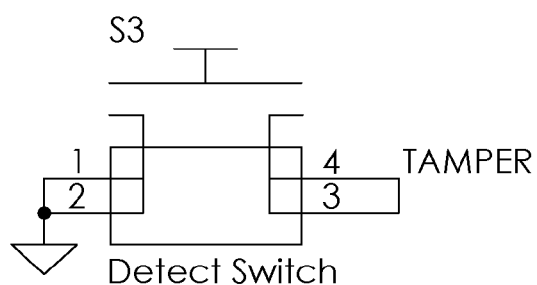
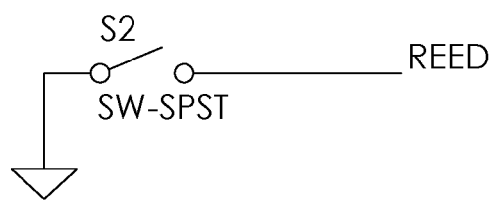
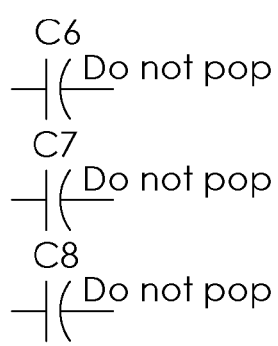
FIG. 7C

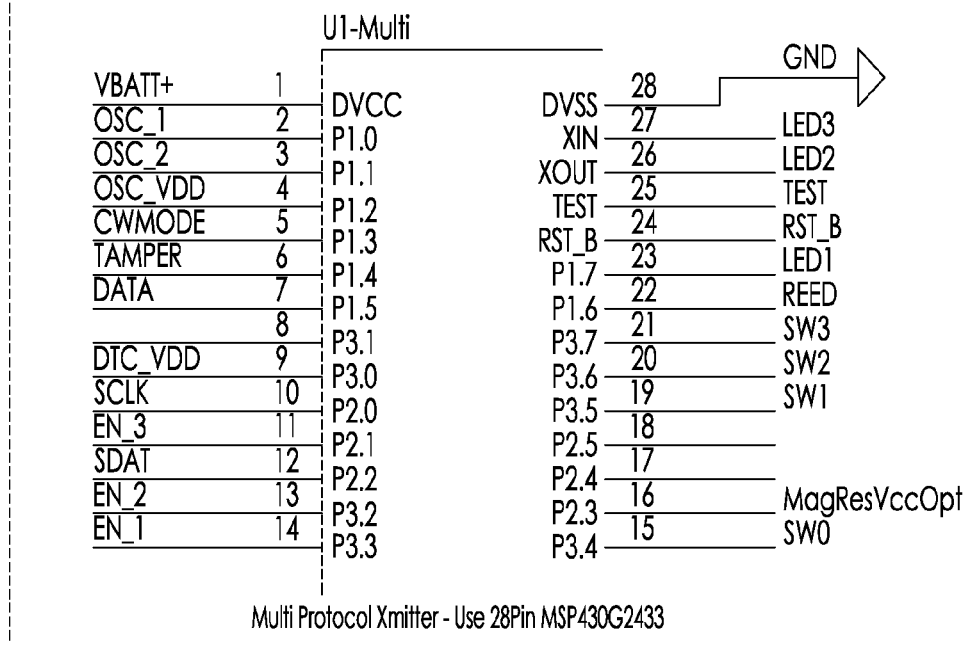
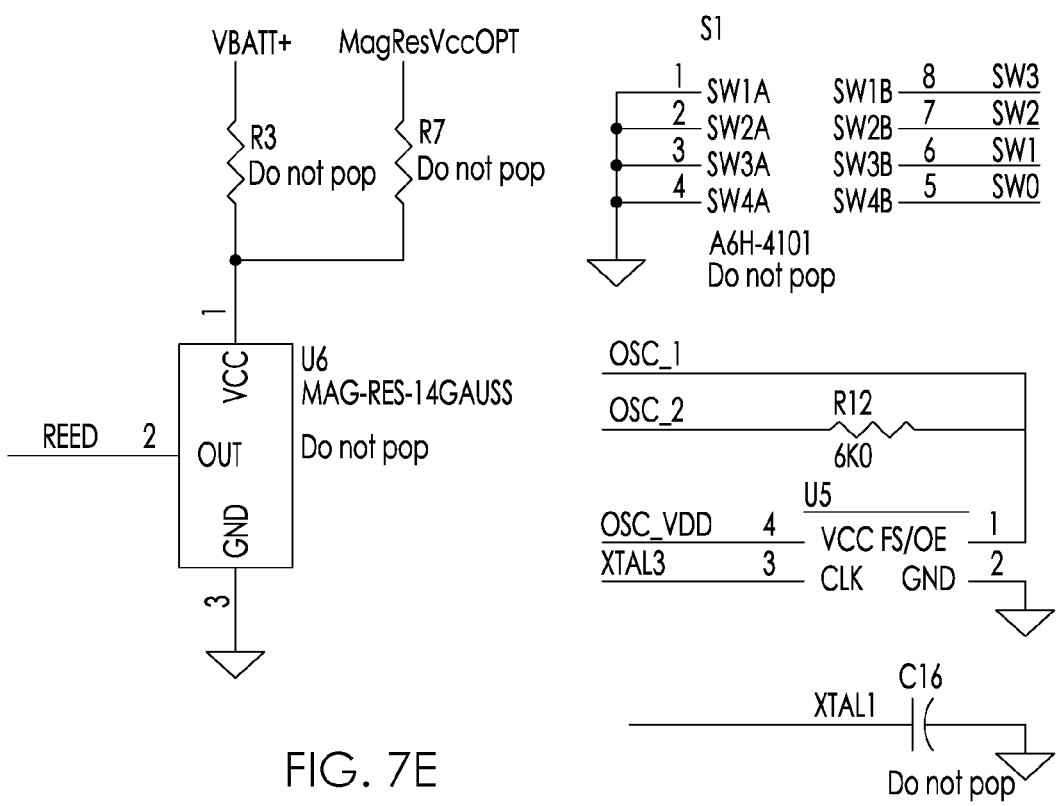
FIG. 7E

MAGNETIC FIELD SENSOR FOR USE IN A SECURITY ALARM SYSTEM

BACKGROUND OF THE INVENTION

Field of the Invention

The present invention relates to a magnetic field sensor and, in particular, to a magnetic field sensor provided with an indicator which indicates the presence or absence of a magnetic field.

Description of the Related Art

It is known to provide a magnetic field sensor with a light-emitting diode indicator. U.S. Pat. No. 4,296,410, which issued on Oct. 20, 1981 to Higgs et al., discloses an integrated circuit including a Hall element and a threshold detector. The threshold detector is encased in a plastic housing with the plane of the Hall element parallel with a face of the housing to provide a two-state Hall element proximity sensor. A light-emitting diode is mounted in the housing and is connected to the output of the detector. This provides visual indication of the state of the sensor. A kit includes the sensor and a compatible magnet which may be used as a proximity sensor in a security alarm system.

SUMMARY OF THE INVENTION

It is an object of the present invention to provide a magnetic field sensor having an indicator which indicates the presence or absence of a magnetic field.

There is accordingly provided a magnetic field sensor comprising a microprocessor and an indicator which turns on when a magnetic field is sensed and turns off when a magnetic field is not sensed. The microprocessor renders the indicator inoperable a predetermined period of time after the magnetic field sensor is powered up.

There is also provided a magnetic proximity sensor including a magnet which generates a magnetic field and a magnetic field sensor. The magnetic field sensor comprises a microprocessor and an indicator which turns on when a magnetic field generated by the magnet is sensed and turns off when a magnetic field generated by the magnet is not sensed. The microprocessor renders the indicator inoperable a predetermined period of time after the magnetic field sensor is powered up.

The further provided a magnetic proximity sensor comprising a magnet which generates a magnetic field and a magnetic field sensor. The magnetic field sensor includes a radio and an antenna which can transmit an output signal on a plurality of output frequencies. A microprocessor is programmed with a plurality of data protocols. Each of the output frequencies operates on at least one of the data protocols. There is a dip switch which is actuated to provide a code to the microprocessor. A data protocol is implemented by the microprocessor based on the code. There is a MEMS oscillator programmed to a discrete frequency based on the data protocol implemented by the microprocessor. The MEMS oscillator provides the discrete frequency to the radio. The radio is provided with single phase-locked loop which generates the output signal based on the discrete frequency. The single phase-locked loop may be a ×32 multiplier.

The magnetic field sensor may further include an indicator which turns on when a magnetic field generated by the magnet is sensed and turns off when a magnetic field generated by the magnet is not sensed. The microprocessor may render the indicator inoperable a predetermined period of time after the magnetic field sensor is powered up. The indicator may be an auditory indicator, a vibratory indicator or a visual indicator. The power source supplies current to the indicator. The magnetic field sensor may further include a circuit board and a housing with an opening. The dip switch and the indicator may be mounted on opposite sides of the circuit board. The circuit board may be disposed in the housing with the dip switch being accessible through the opening.

In one example, the indicator may be a light-emitting diode. The power source may be a coin cell battery. The magnetic field sensor may include a supercapacitor. The magnetic field sensor may also include a tamper switch.

The sensors disclosed herein may be used together with a magnet as a proximity sensor, for example, as a door sensor or window sensor in a security alarm system.

BRIEF DESCRIPTIONS OF DRAWINGS

The invention will be more readily understood from the following description of the embodiments thereof given, by way of example only, with reference to the accompanying drawings, in which:

FIG. 3 is another perspective view of the magnet and the magnetic field sensor of FIG. 1;

FIG. 7A to 7E is a circuit diagram of the magnetic field sensor of FIG. 1;

DESCRIPTIONS OF THE PREFERRED EMBODIMENTS

Figure 1:
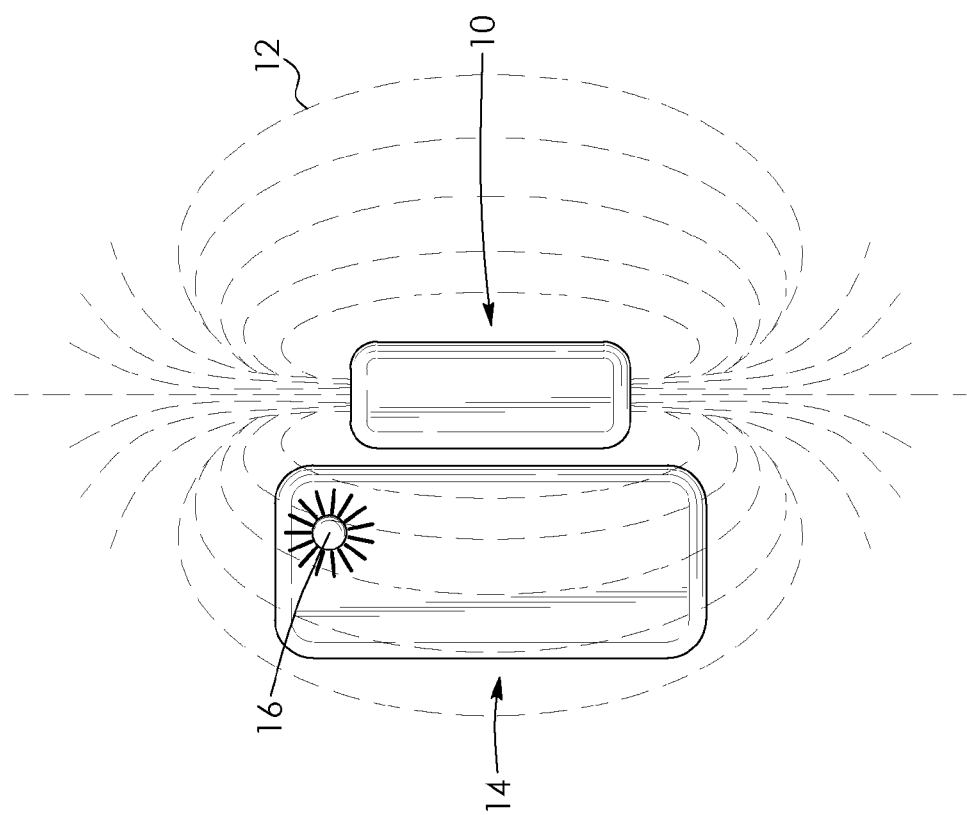
FIG. 1 is a perspective view of a magnet and a first magnetic field sensor.
Figure 2:
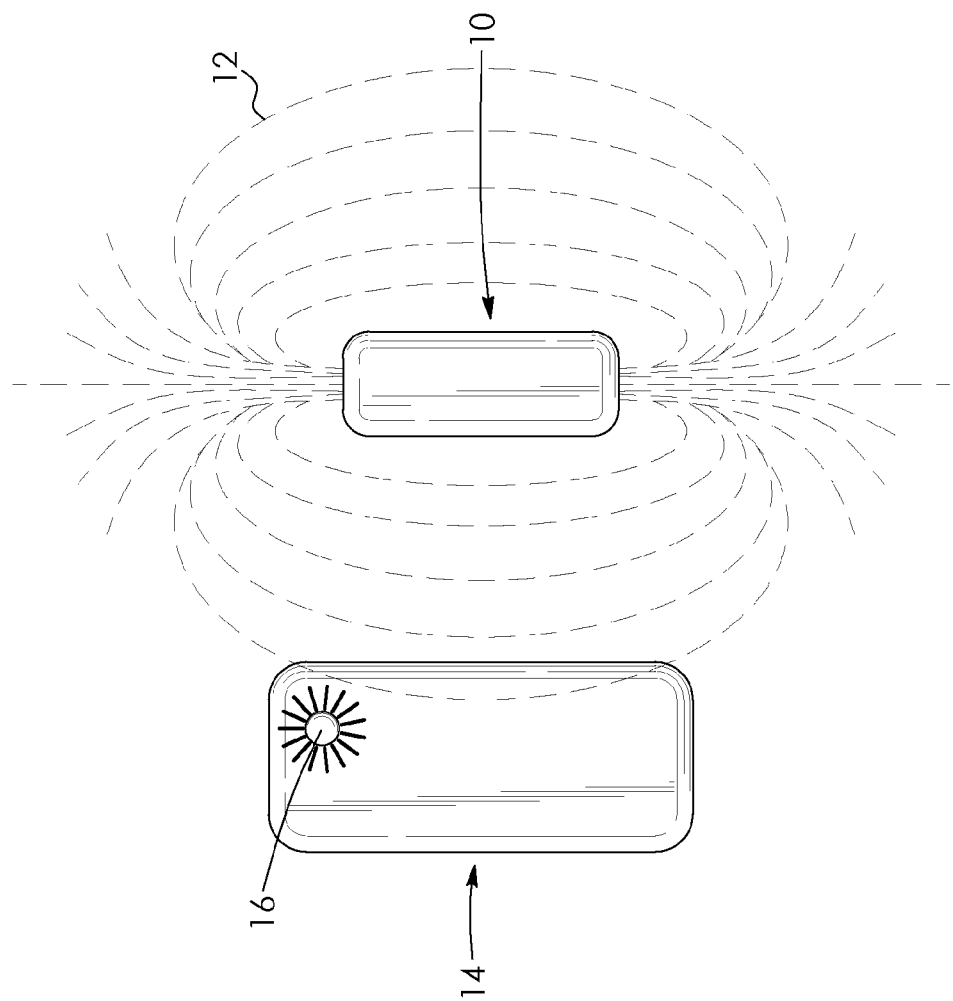
FIG. 2 is another perspective view of the magnet and the magnetic field sensor of FIG. 1.

Referring to the drawings and first to FIGS. 1 to 3, a magnet 10 is shown. The magnet 10 generates a magnetic field 12 which is sensed by a magnetic field sensor 14. The magnetic field sensor 14 includes an indicator which, in this example, is a visual indicator in the form of an indicator light 16 that turns on when the magnetic field sensor 14 is within the magnetic field 12 as shown in FIGS. 1 and 2. The indicator light 16 turns off when the magnetic field sensor 14 is outside the magnetic field 12 as shown in FIG. 3. The indicator light 16 may accordingly provide a visual indication as to the presence or absence of a magnetic field. Together with magnet 10 and magnetic field sensor 14 may be used as a magnetic proximity sensor.

Figure 4:
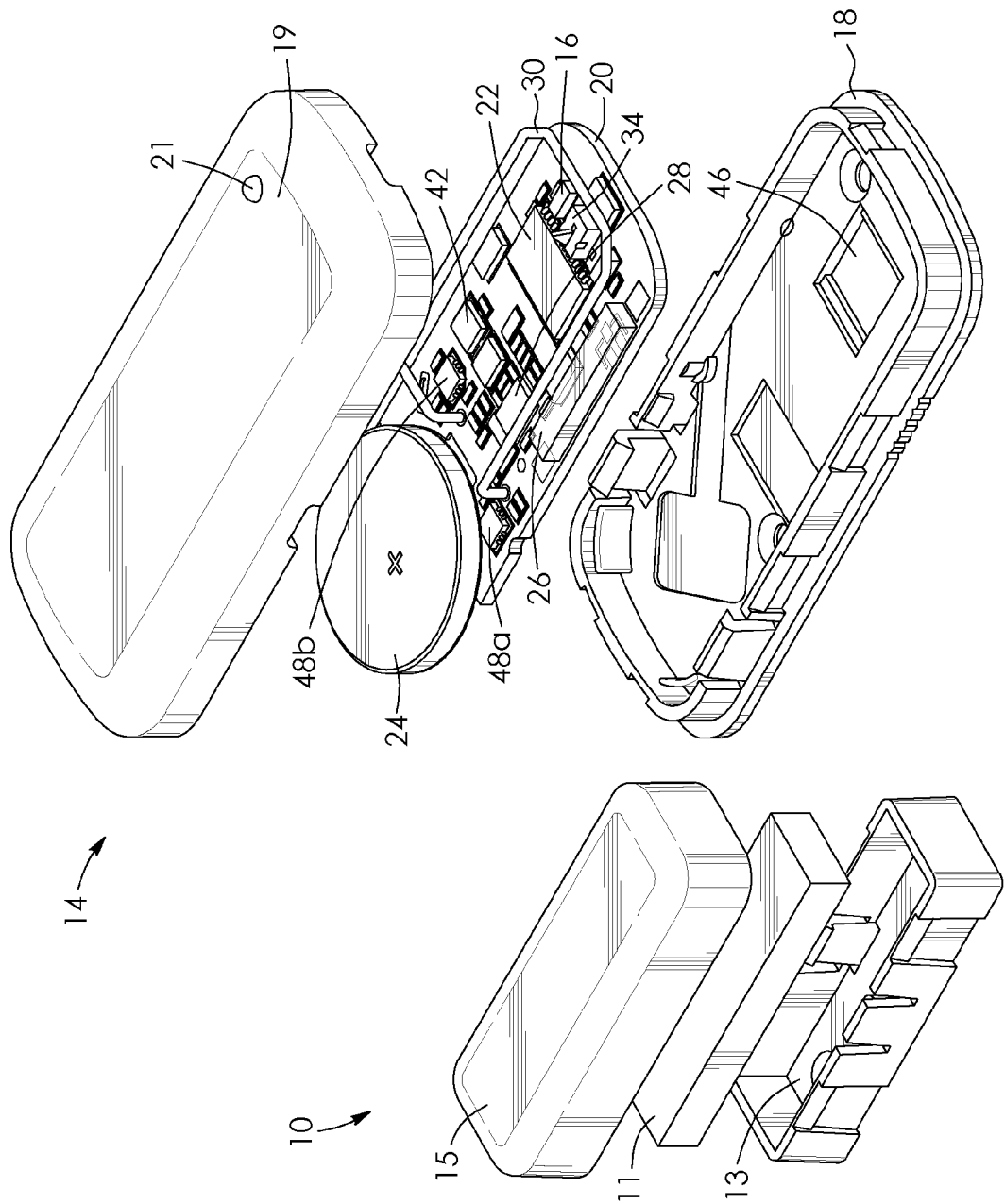
FIG. 4 is an exploded view of the magnet and the magnetic field sensor of FIG. 1.

The magnet 10 is shown in greater detail in FIG. 4 and, in this example, is a bar magnet 11 which is disposed in a housing 13 provided with a cover 15. The magnetic field sensor 14 is also shown in greater detail in FIG. 4 and, in this example, is a substantially rectangular parallelepiped with rounded corners but may be other shapes. The magnetic field sensor 14 includes a housing 18 and a circuit board 20 disposed within the housing. The housing 18 is provided with a lid 19 that has a window 21 to facilitate viewing of the indicator light 16 which is mounted on the circuit board 20. The window 21 may be an aperture in the lid 19 or a translucent portion of the lid 19. A microprocessor 22, a power source which is in the form of a coin cell battery 24, and a device which senses a magnetic field which is in the form of a reed switch 26 are also mounted on the circuit board 20. It will however be understood by a person skilled in the art that any AC or DC power source may be used. Likewise any device which senses a magnetic field such as a magnetoresistive sensor or Hall Effect sensor or MAGNASPHERE™ may be used in place of the reed switch.

In this example, the indicator light 16 is a light-emitting diode package and includes a blue light-emitting diode, a green light-emitting diode, and a red light-emitting diode. The reed switch 26 is actuated by a magnetic field and the microprocessor 22 monitors the change of state of the reed switch 26 by periodically sampling the reed switch 26 to sense a magnetic field. If a magnetic field is sensed then the microprocessor 22 turns on the indicator light 16. In the absence of a magnetic field, the microprocessor 22 turns the indicator light 16 off. The sampling of the reed switch 26 by the microprocessor 22 may be done, for example, four times per second or as many times per second as required. The sensitivity of the magnetic field sensor 14 may be adjusted by selecting different types of reed switches. This may be used to set a maximum or minimum distance at which the magnetic field sensor 14 is able to sense a magnet. If another device which senses a magnetic field is used in the magnetic sensor, such as a magnetoresistive sensor or Hall Effect sensor or MAGNASPHERE™, then the sensitivity of the magnetic field sensor may be adjusted based on measured analog and/or digital output.

Figure 5:
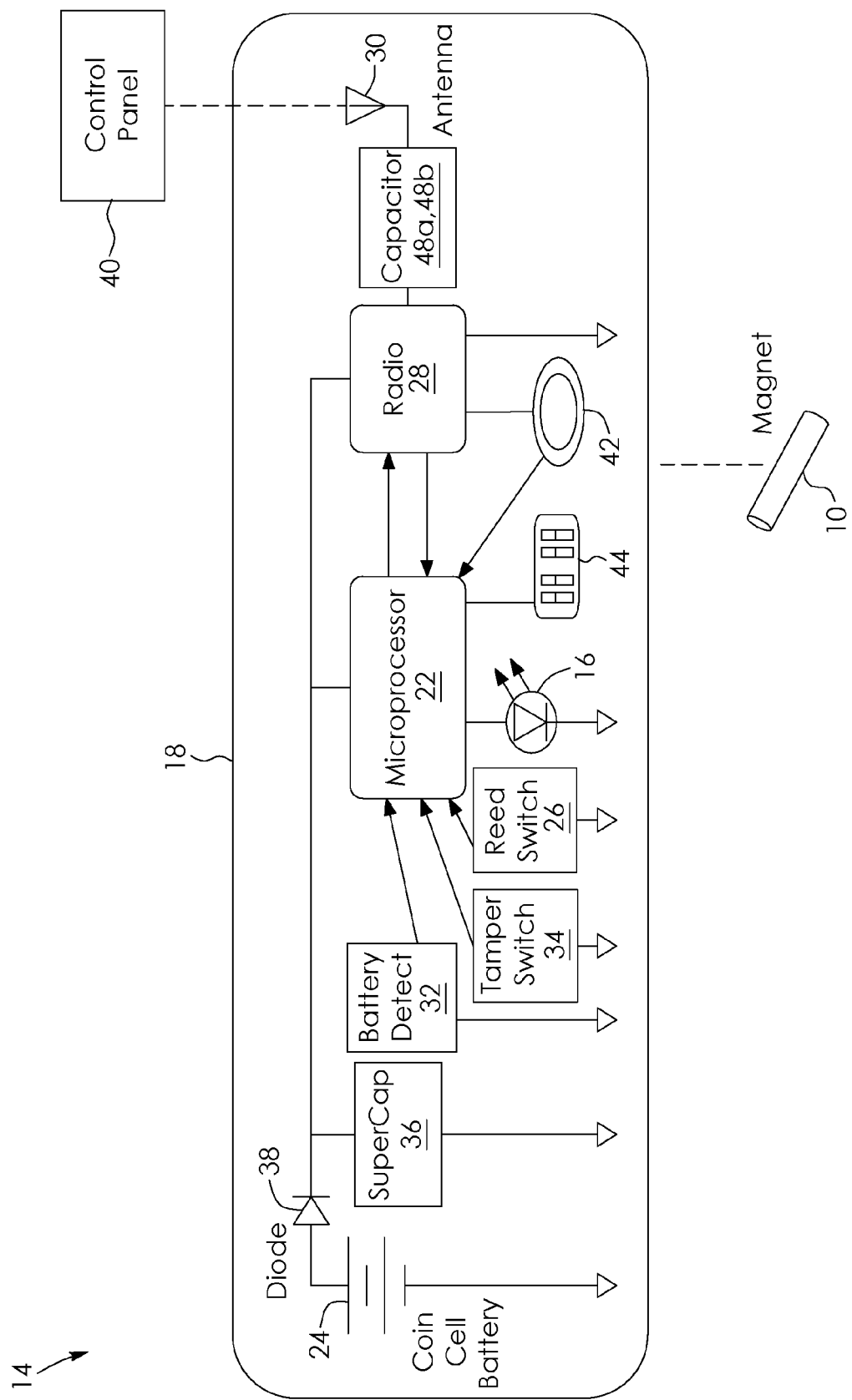
FIG. 5 is a schematic diagram of the magnetic field sensor of FIG. 1.

Referring now to FIG. 5, in this example, the magnetic field sensor 14 includes a radio, which is in the form of a radio chip 28 in this example, and an antenna 30 that allows the magnetic field sensor 14 to transmit and receive radio signals. The antenna 30 may communicate with a control panel 40 as part of a security alarm system. There is also a battery detection circuit 32, a tamper switch 34, and a supercapacitor 36. The battery detection circuit 32 and tamper switch 34 are both conventional and in communication with the microprocessor 22. The supercapacitor 36 may be used to assist the coin cell battery 24 as the power source. Without the supercapacitor 36 the coin cell battery 24 may not be able to provide the surge current required when the radio chip 28 and the antenna 30 transmit and receive radio signals. This is due to the internal resistance of a coin cell battery. A coin cell battery generally cannot be used in applications requiring current in excess of about 20 to 30 milliamperes. The internal resistance of the coin cell battery causes a voltage drop when larger currents are required. This may cause the terminal voltage to drop below a minimum acceptable level of, for example, 2.2 volts.

The supercapacitor 36 may have a low profile which, in combination with use of the coin cell battery 24, allows the magnetic field sensor 14 to be relatively small. The supercapacitor 36 allows for high short term current draws while still providing a terminal voltage of, for example, 3.0 volts. Without the supercapacitor 36 a larger battery may have to be used as a power source. The supercapacitor 36 may have a sufficient residual charge to prevent the microprocessor 22 from properly detecting the removal of the coin cell battery 24 during battery replacement. However, the battery detection circuit 32 allows the microprocessor 22 to shut down properly when the coin cell battery 24 is removed. There may also be a reverse voltage protection circuit 38, which may be a diode or P-channel mosfet, connected in series between the coin cell battery 24 and the supercapacitor 36 to ensure that the coin cell battery 24 is not reverse charged if the supercapacitor 36 has a higher voltage. The tamper switch 34 may be internal or external of the housing 18 and detects when the lid 19 of the housing 18 is removed and sends a signal to the microprocessor that the lid 19 of the housing 18 has been removed and someone is tampering with the magnetic field sensor 14. The tamper switch 34 also sends a signal to the microprocessor 22 to restart an algorithm related to the sensing of a magnetic field when the tamper switch 34 detects that the lid 19 of the housing 18 has been removed. In other examples, the magnetic field sensor may not have a tamper switch and the microprocessor may be signaled to restart the algorithm related to the sensing of a magnetic field when the coin cell battery is inserted. The microprocessor may alternatively be signaled to restart the algorithm related to the sensing of a magnetic field when and ON/OFF switch is actuated. Such an ON/OFF switch may be used turn the indicator on and off.

Figure 6:
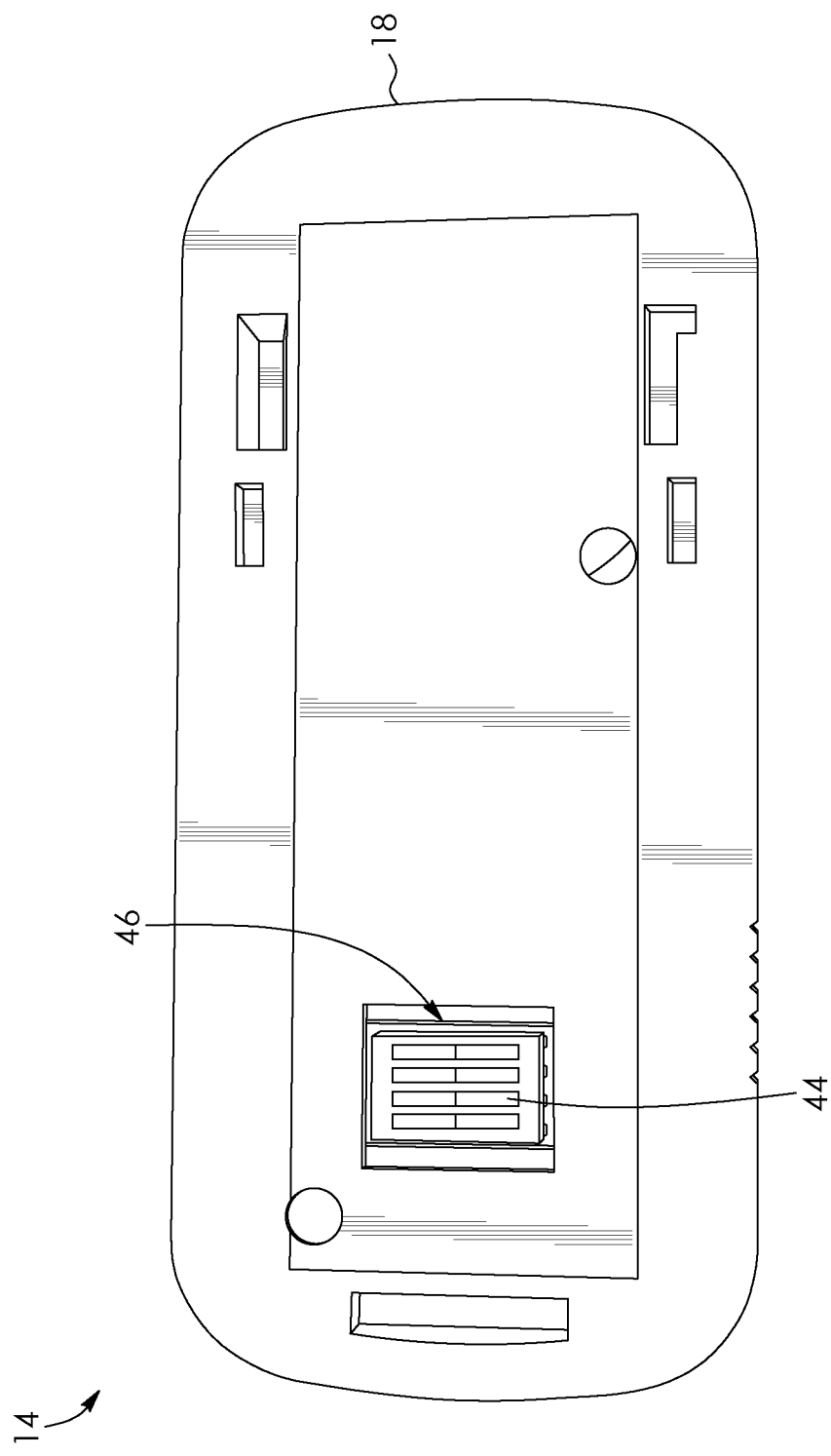
FIG. 6 is a bottom plan view of the magnetic field sensor of FIG. 1.
Figure 7A:
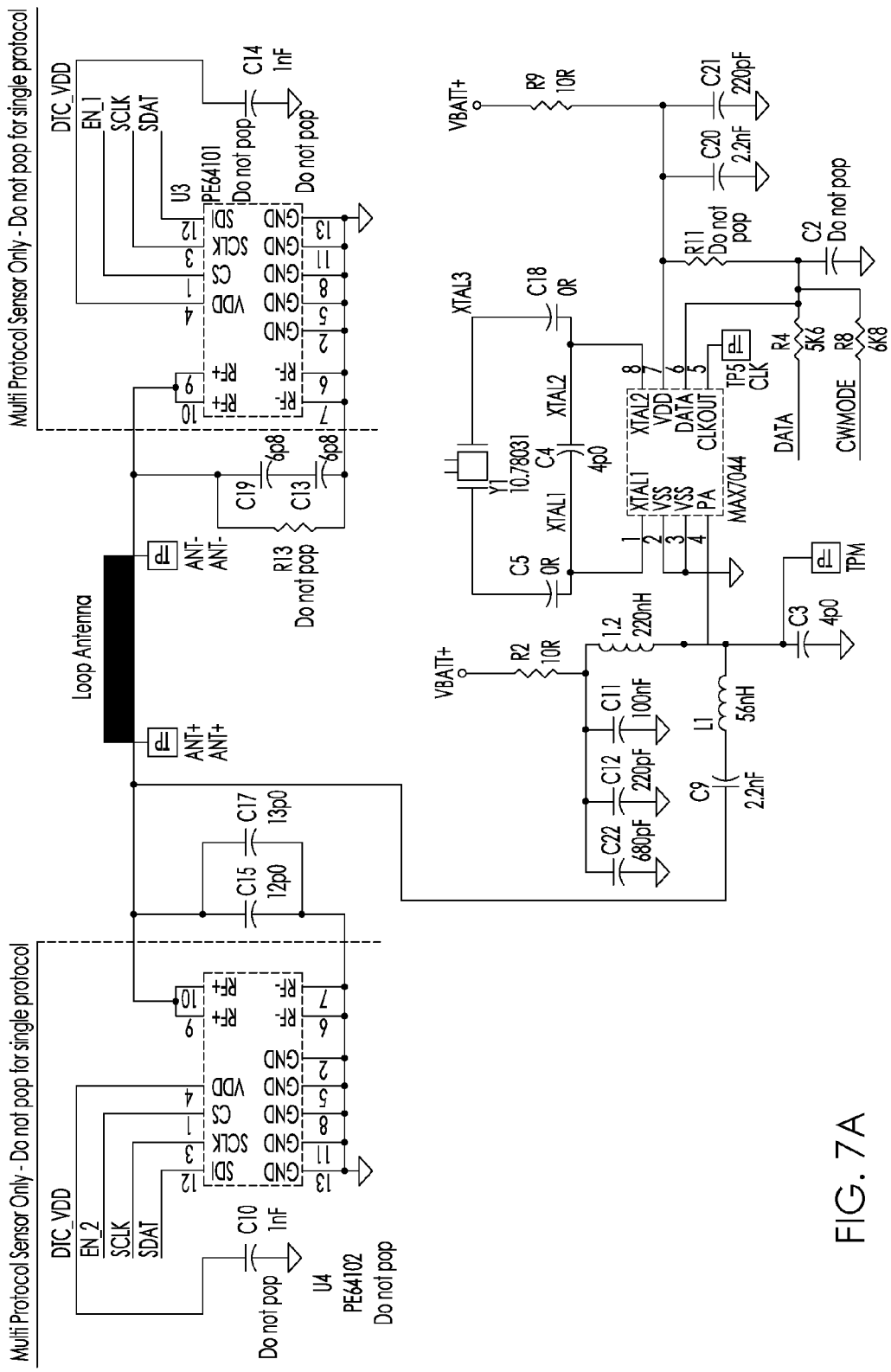
Figure 7B:
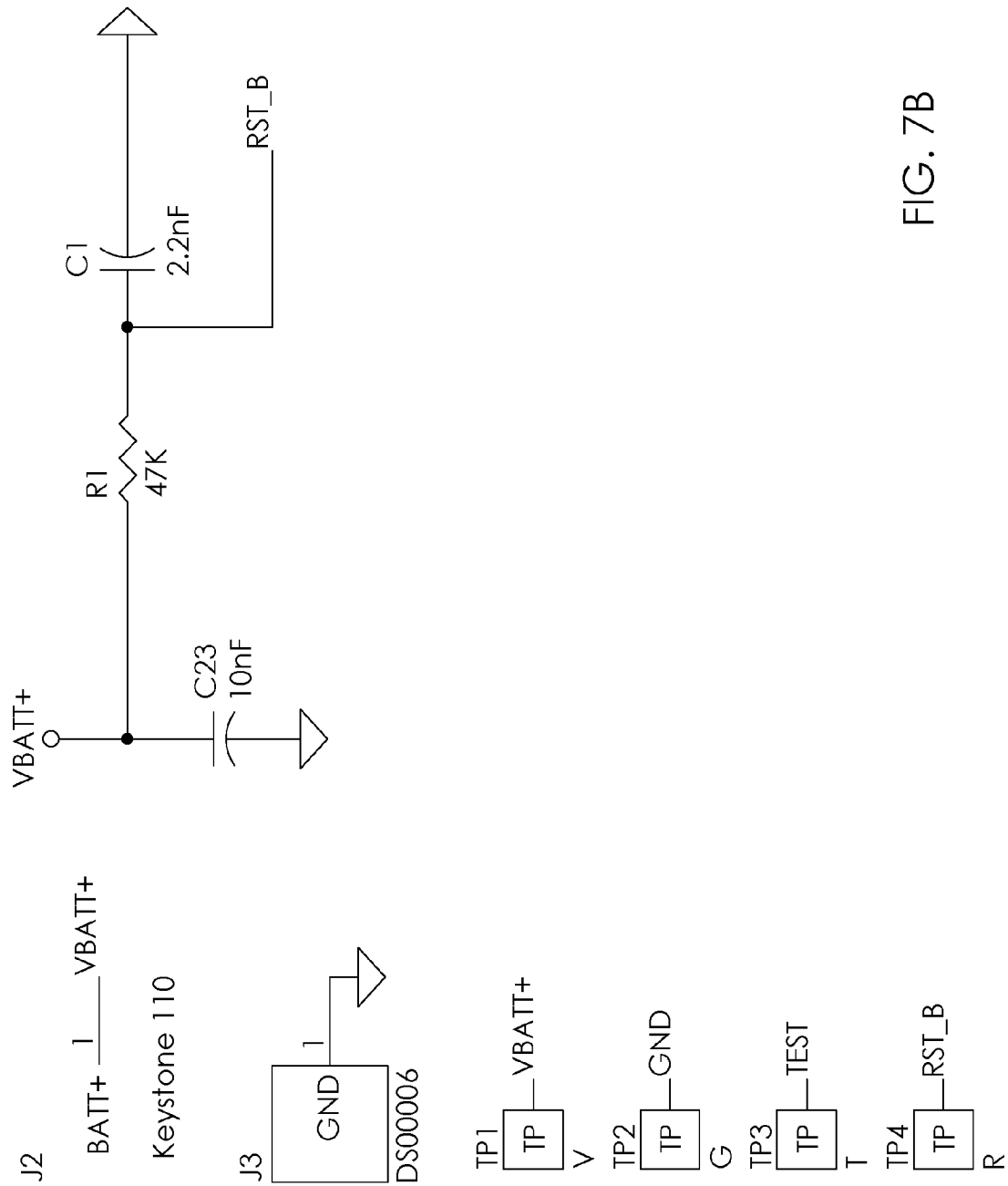
Figure 7D:
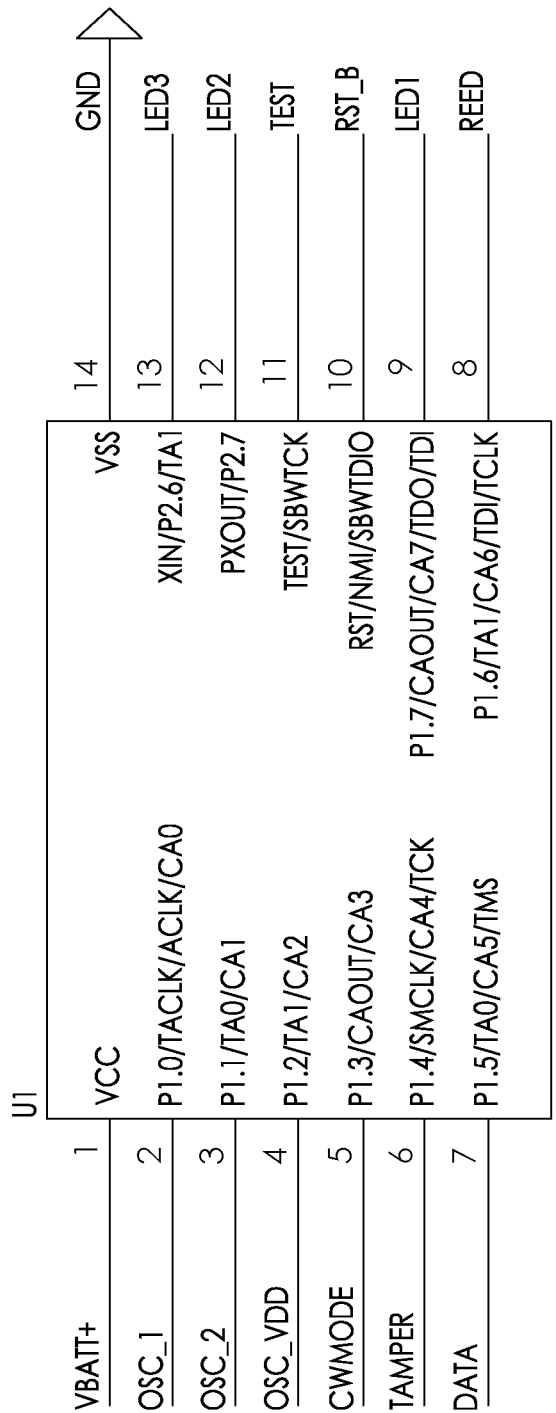

The magnetic field sensor 14 is further provided with a MEMS oscillator 42 which may be programmed to a plurality of discrete frequencies and, in this example, to at least four discrete frequencies which are feed to the radio chip 28 to generate an output frequency ranging between 250 MHz and 1 GHz. The MEMS oscillator 42 is able to provide the at least four discrete frequencies to the radio chip 28 without an additional phase locked loop being required to generate the output frequency, or output signal 41, because the radio chip 28 is provided with a single phase-locked loop 29, for example, a ×32 multiplier to generate the output frequency. There is also a dip switch 44 which, in this example, is a four position dip switch. Referring now to FIG. 6, the dip switch 44 is mounted on a side of the circuit board 20 opposite of the indicator light 16. This allows the dip switch 44 to be accessed through an aperture 46 in the housing 18 as shown in FIG. 6.

The microprocessor 22 is programmed with a plurality of data protocols and each output frequency may operate on at least one of the data protocols. The dip switch 44 is actuated to provide a code to the microprocessor 22 and a data protocol is implemented by the microprocessor 22 based on the code. The MEMS oscillator 42 is programmed to a discrete frequency based on the data protocol implemented by the microprocessor 22. The MEMS oscillator 42 then provides the discrete frequency to the radio chip 28 which an output signal 41 based on the discrete frequency. This allows an installer to select a discrete frequency to match the protocol of a given alarm system. Respective ones of digitally tuned capacitor chips 48a and 48b are disposed at each terminal of the antenna 30. The capacitor chips 48a and 48b are used in a shunt mode rather than a series mode to prevent a degradation of antenna performance resulting due to stray capacitance issues when the capacitor chips 48a and 48b are used in series. Using the capacitor chips 48a and 48b in a shunt configuration may allow the antenna 30 to be tuned. The supercapacitor 36 may maintain a maximum output signal by maintaining the voltage at its maximum value during transmission of the output signal. A circuit diagram of the magnetic field sensor is shown in FIGS. 7A to 7E.

Figure 8:
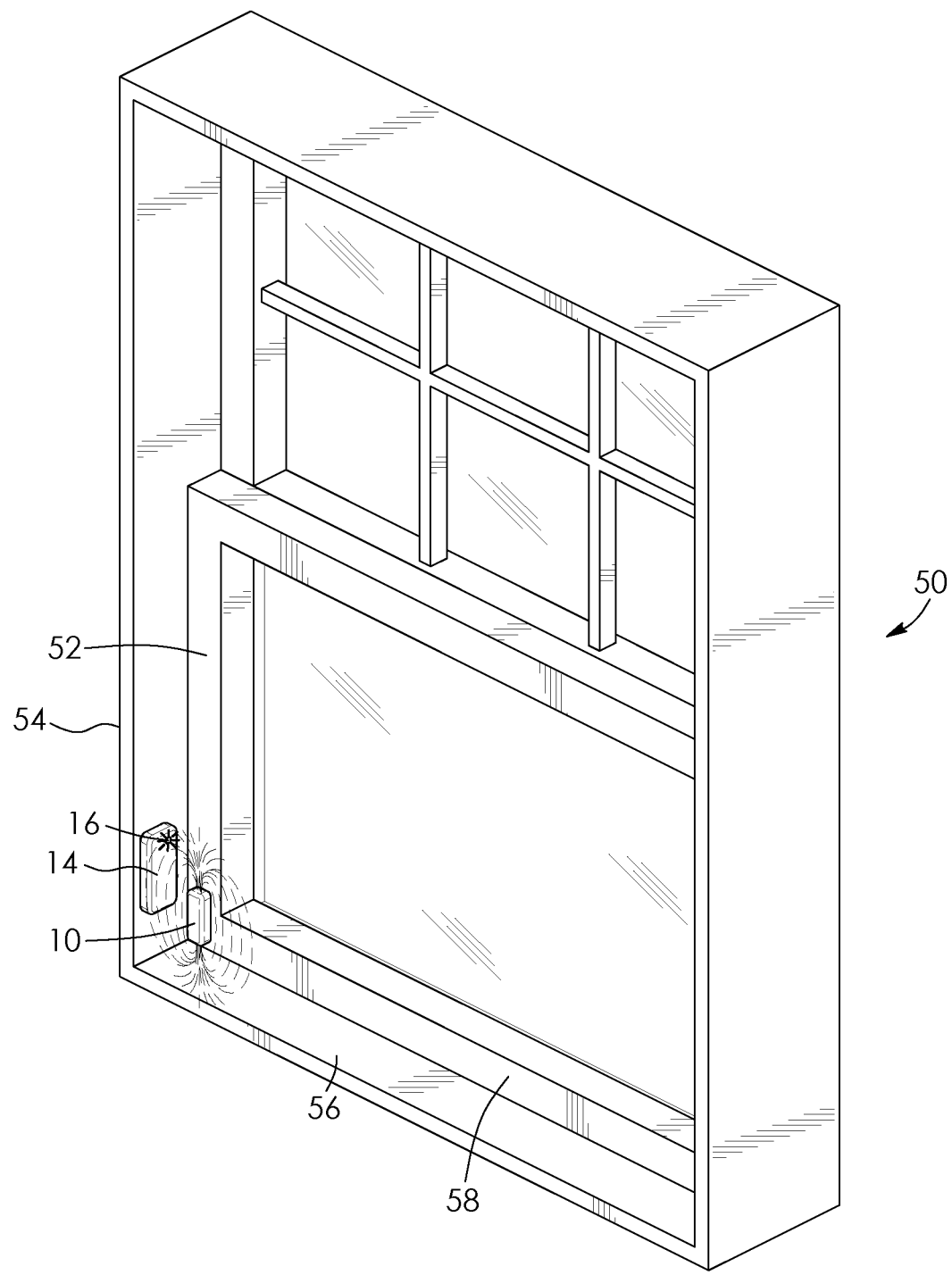
FIG. 8 is a perspective view showing the magnet and the magnetic field sensor of FIG. 1 being used as a window sensor in a security alarm system with the window closed.
Figure 9:
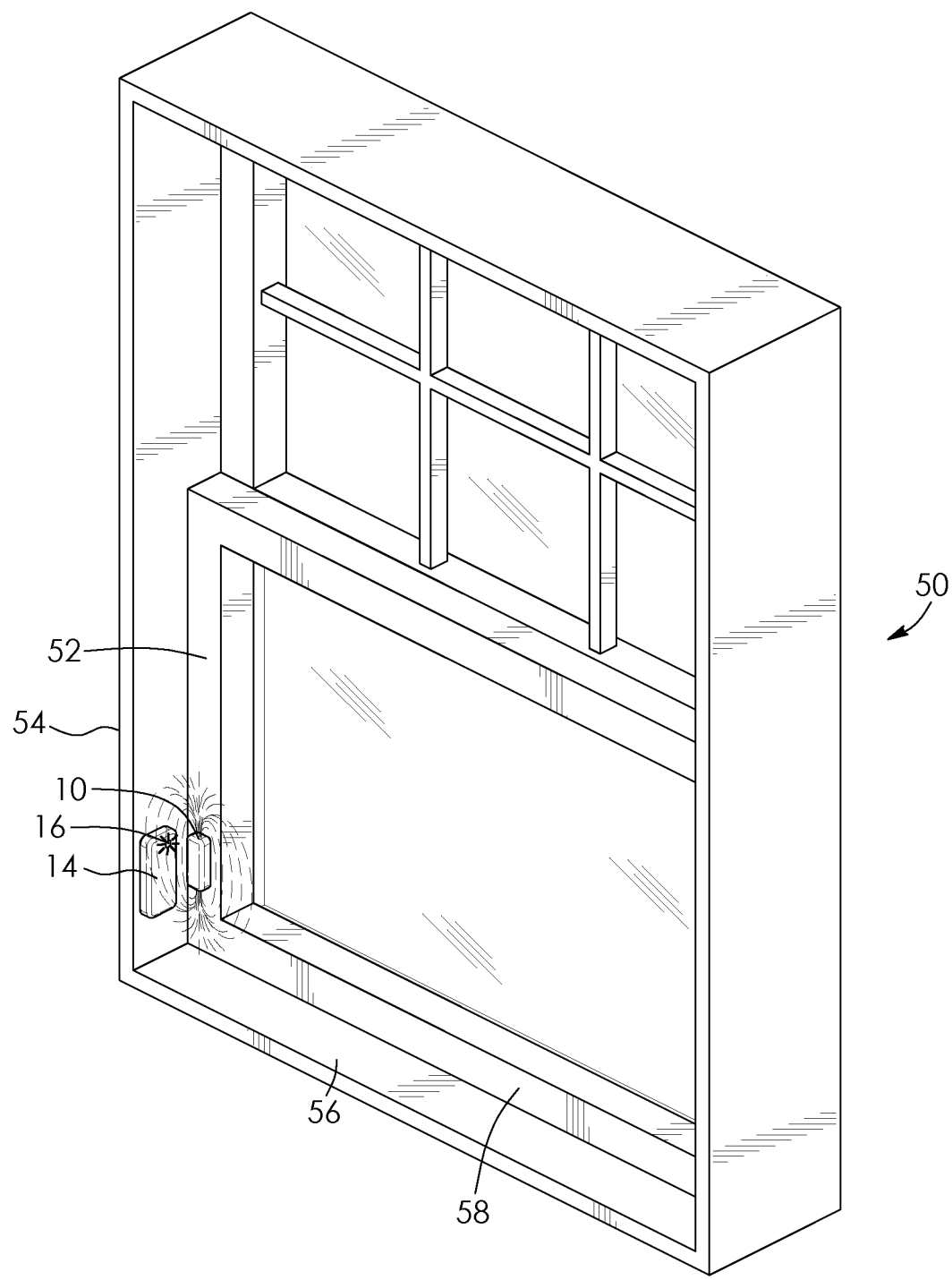
FIG. 9 is another perspective view showing the magnet and the magnetic field sensor of FIG. 1 being used as a window sensor in a security alarm system with the window closed.
Figure 10:
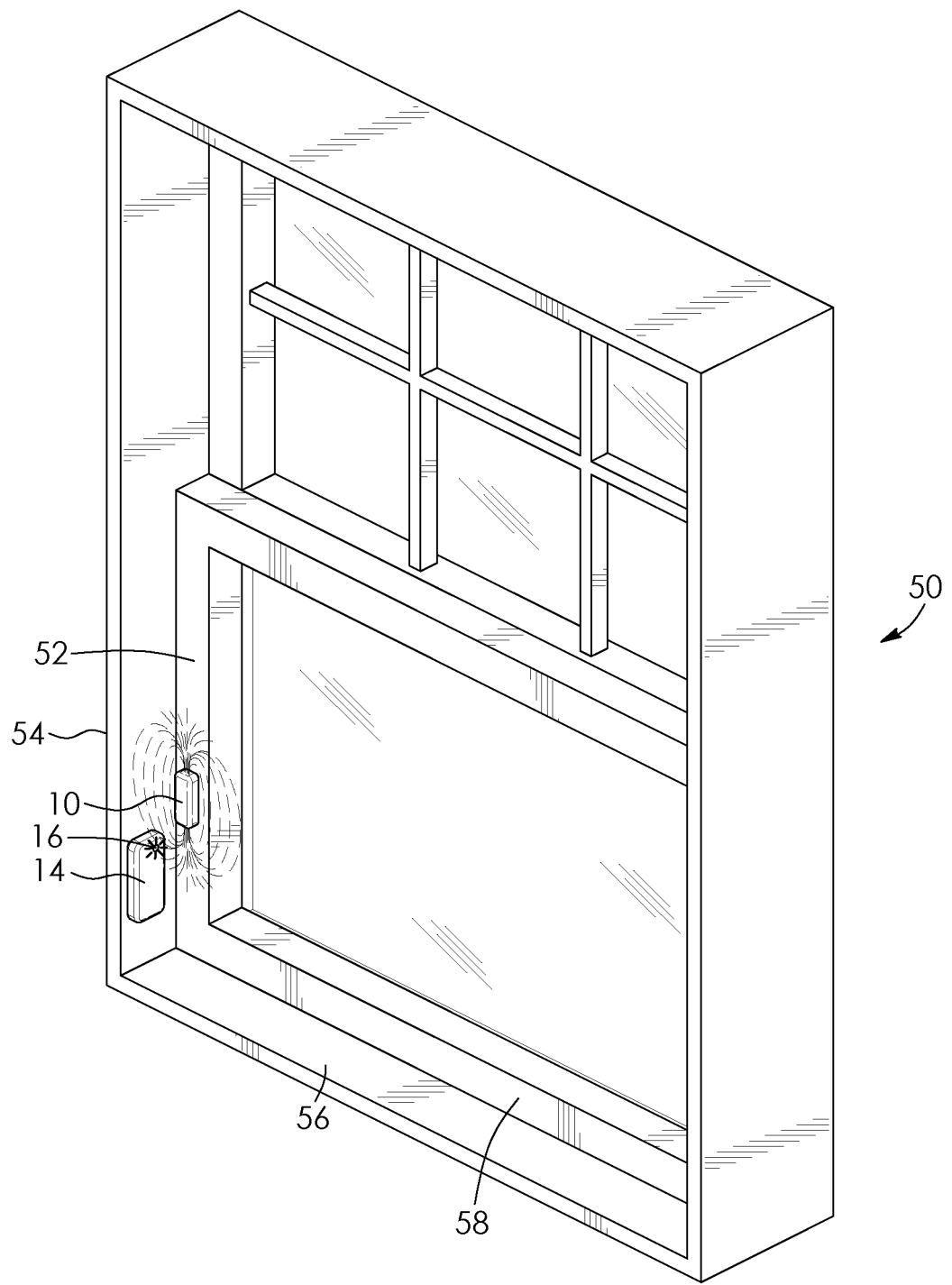
FIG. 10 is another perspective view showing the magnet and the magnetic field sensor of FIG. 1 being used as a window sensor in a security alarm system with the window closed.

Referring now to FIGS. 8 to 17, the magnet 10 and magnetic field sensor 14 are shown in use as a proximity sensor in the form of a window sensor of a security alarm system. It will however be understood by a person skilled in the art that the magnet 10 and magnetic field sensor 14 may also be used as a door sensor or in any other proximity sensor application. The magnet 10 and magnetic field sensor 14 are each mounted on a window 50 with the magnetic field sensor 14 generally being mounted first, although this is not strictly required. The magnet 10 is mounted on a stile 52 of the window 50 while the magnetic field sensor 14 is mounted on a side jamb 54 of the window near a sill 56 thereof. The window 50 is fully closed in FIGS. 8 to 10 with a bottom rail 58 of the window abutting the sill 56 thereof. When the window 50 is fully closed, the magnetic field sensor 14 is able to sense a magnetic field generated by the magnet 10 when the magnet is mounted along the stile 52 as indicated by the indicator light 16 which is turned on in FIGS. 8 to 10. The indicator light 16 of the magnetic field sensor 14 is turned on when the magnet 10 is mounted on the stile 52 at a first position adjacent to the bottom rail 58 of the window 50 as shown in FIG. 8, at a second position away from the bottom rail 58 of the window 50 as shown in FIG. 9, and at a third position further away from the bottom rail 58 of the window 50 as shown in FIG. 10. This provides a visible confirmation to an installer that, when the magnetic field sensor 14 is mounted on the side jamb 54 of the window 50 near the sill 56 thereof, the magnet 10 may be mounted anywhere on the stile 52 between the first position and the third position for the magnetic field sensor to still be able to sense a magnetic field generated by the magnet. An alarm will accordingly not be triggered when the window 50 is fully closed and the magnet 10 and magnetic field sensor 14 are positioned relative to one another as shown in FIGS. 8 to 10.

Figure 11:
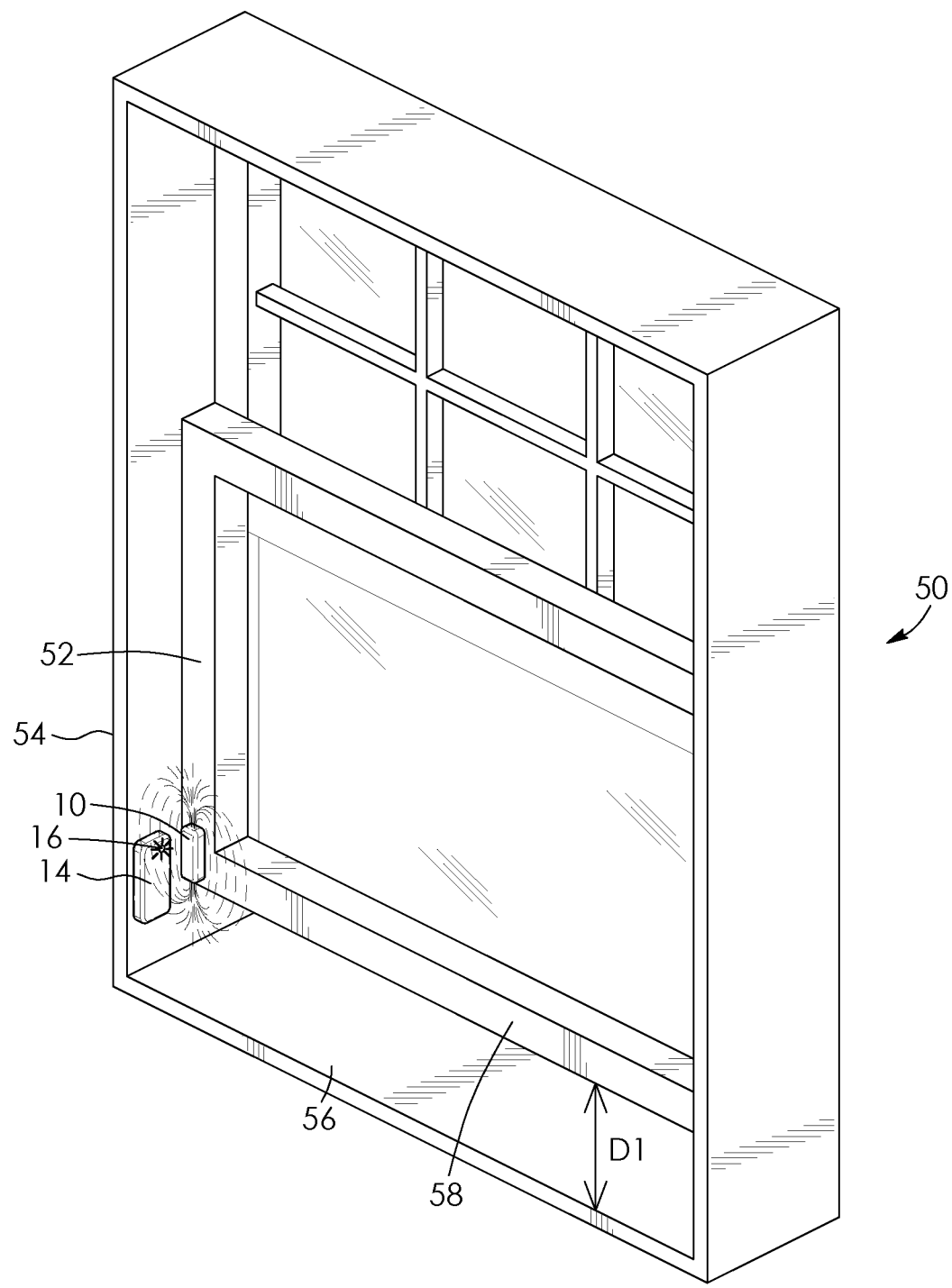
FIG. 11 is a perspective view showing the magnet and the magnetic field sensor of FIG. 1 being used as a window sensor in a security alarm system with the window opened a distance D1.
Figure 12:
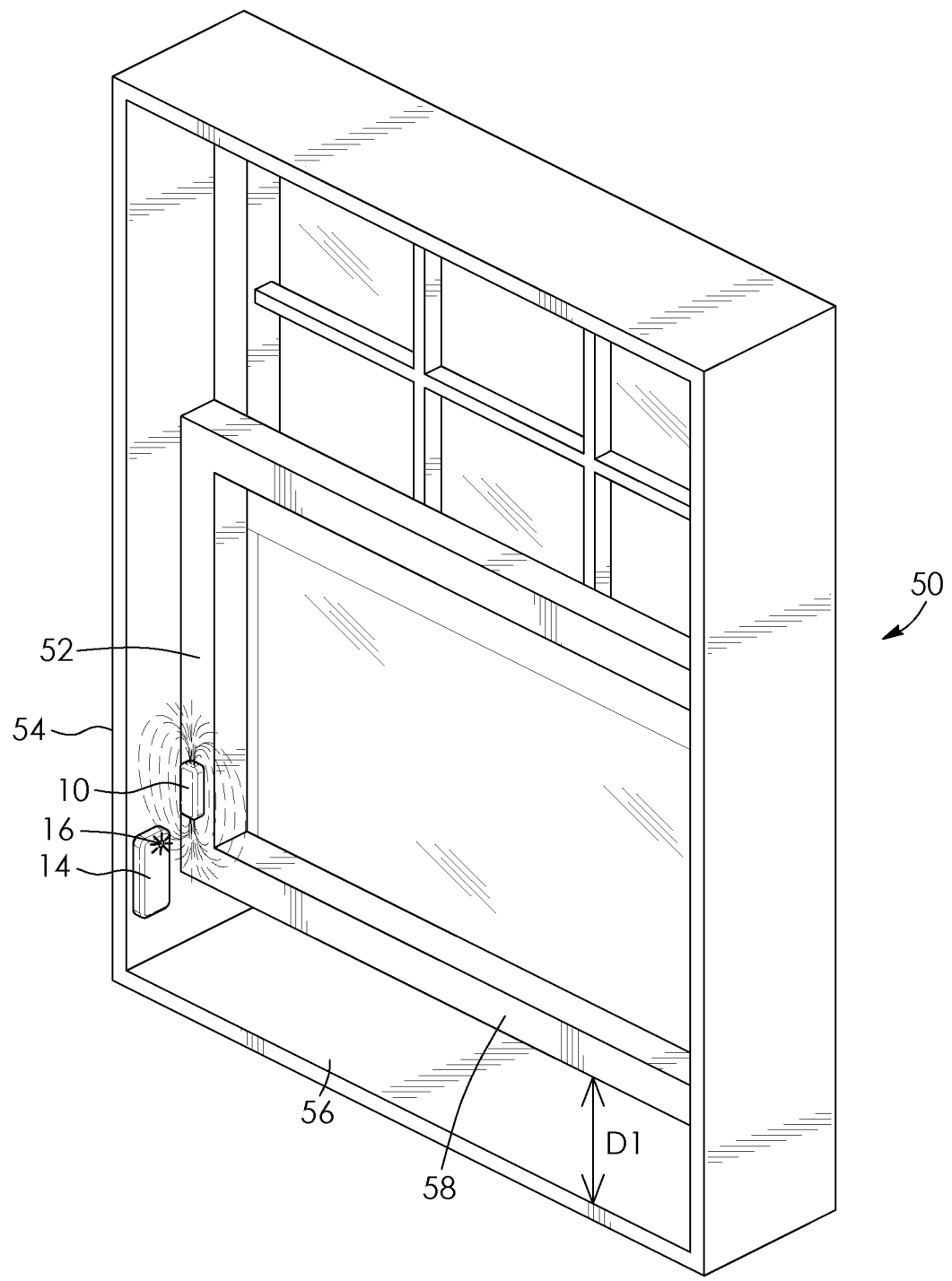
FIG. 12 is another perspective view showing the magnet and the magnetic field sensor of FIG. 1 being used as a window sensor in a security alarm system with the window opened a distance D1.
Figure 13:
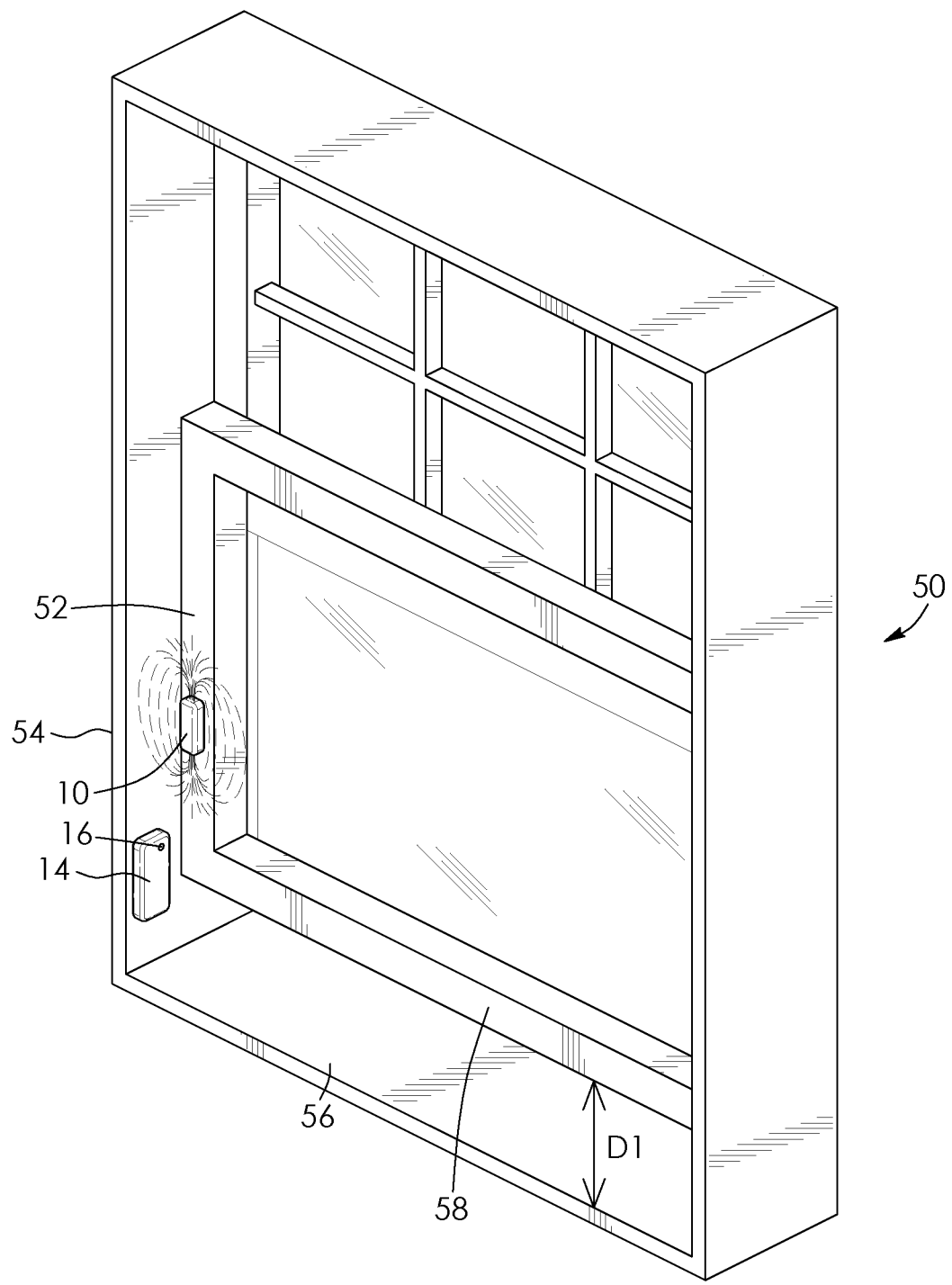
FIG. 13 is another perspective view showing the magnet and the magnetic field sensor of FIG. 1 being used as a window sensor in a security alarm system with the window opened a distance D1.

However, it may be desirable for an alarm to not be triggered when the window 50 is not fully closed. This would allow the window 50 to be partially opened for ventilation but not enough to allow an intruder to enter through the window. For example, as shown in FIGS. 11 to 13, it may be desired to allow the window 50 to be opened a distance of D1 without triggering an alarm. FIG. 11 shows that the magnetic field sensor 14 is able to sense the magnetic field generated by the magnet 10, as visually indicated by the indicator light 16 which is turned on, when the magnet 10 is mounted on the stile 52 adjacent to the bottom rail 58. FIG. 12 shows that the magnetic field sensor 14 is also able to sense the magnetic field generated by the magnet 10, as visually indicated by the indicator light 16 which is turned on, when the magnet 10 is mounted on the stile 52 away from the bottom rail 58. FIG. 13 shows that the magnetic field sensor 14 is unable to sense the magnetic field generated by the magnet 10, as visually indicated by the indicator light 16 which is turned off, when the magnet 10 is mounted on the stile 52 further away from the bottom rail 58. The indicator light 16 accordingly provides a visual indication to an installer as to where on the stile 52 the magnet 10 may be mounted to allow the window 50 to be opened a distance of D1 without triggering an alarm.

Figure 14:
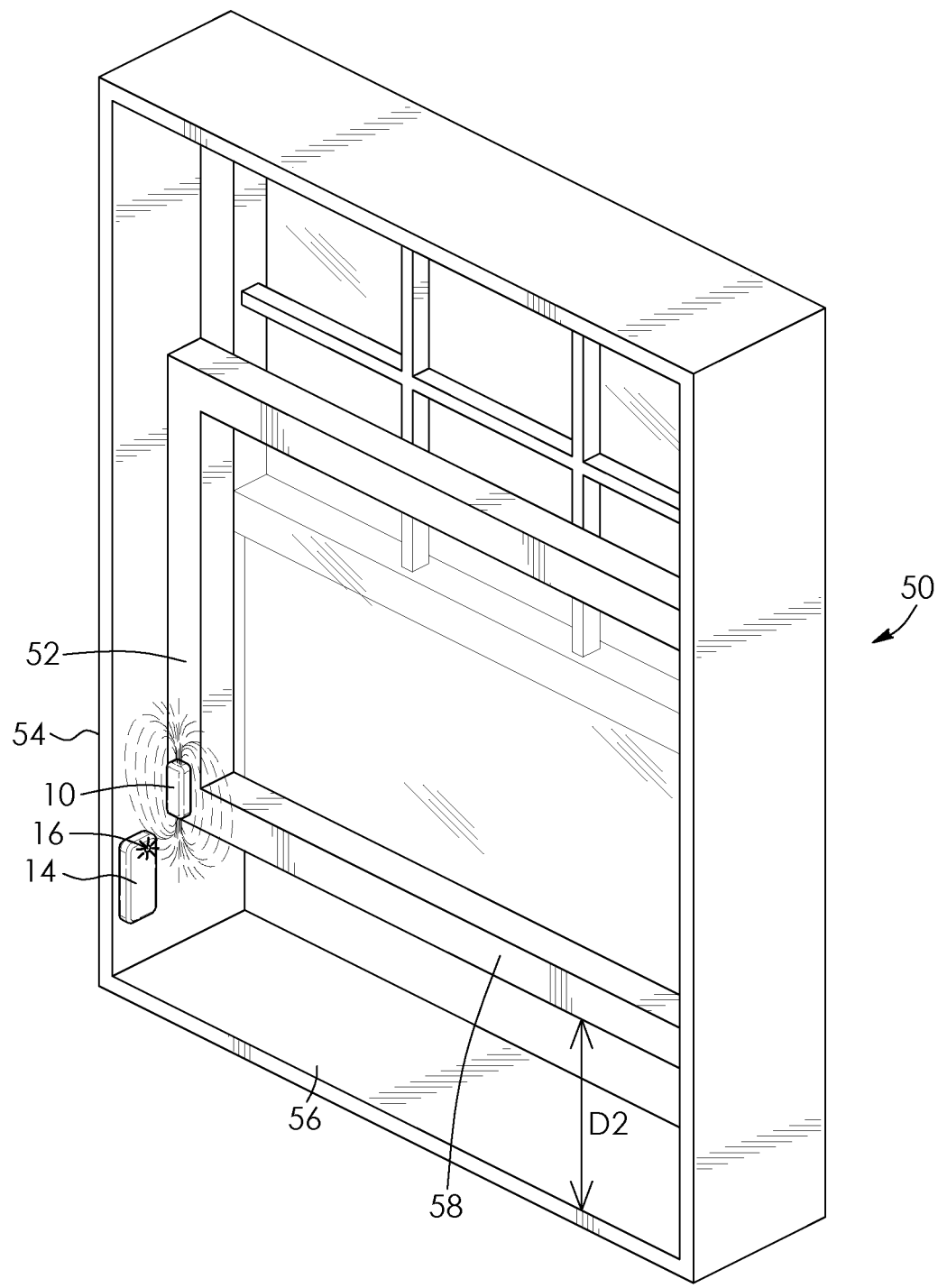
FIG. 14 is a perspective view showing the magnet and the magnetic field sensor of FIG. 1 being used as a window sensor in a security alarm system with the window opened a distance D2.
Figure 15:
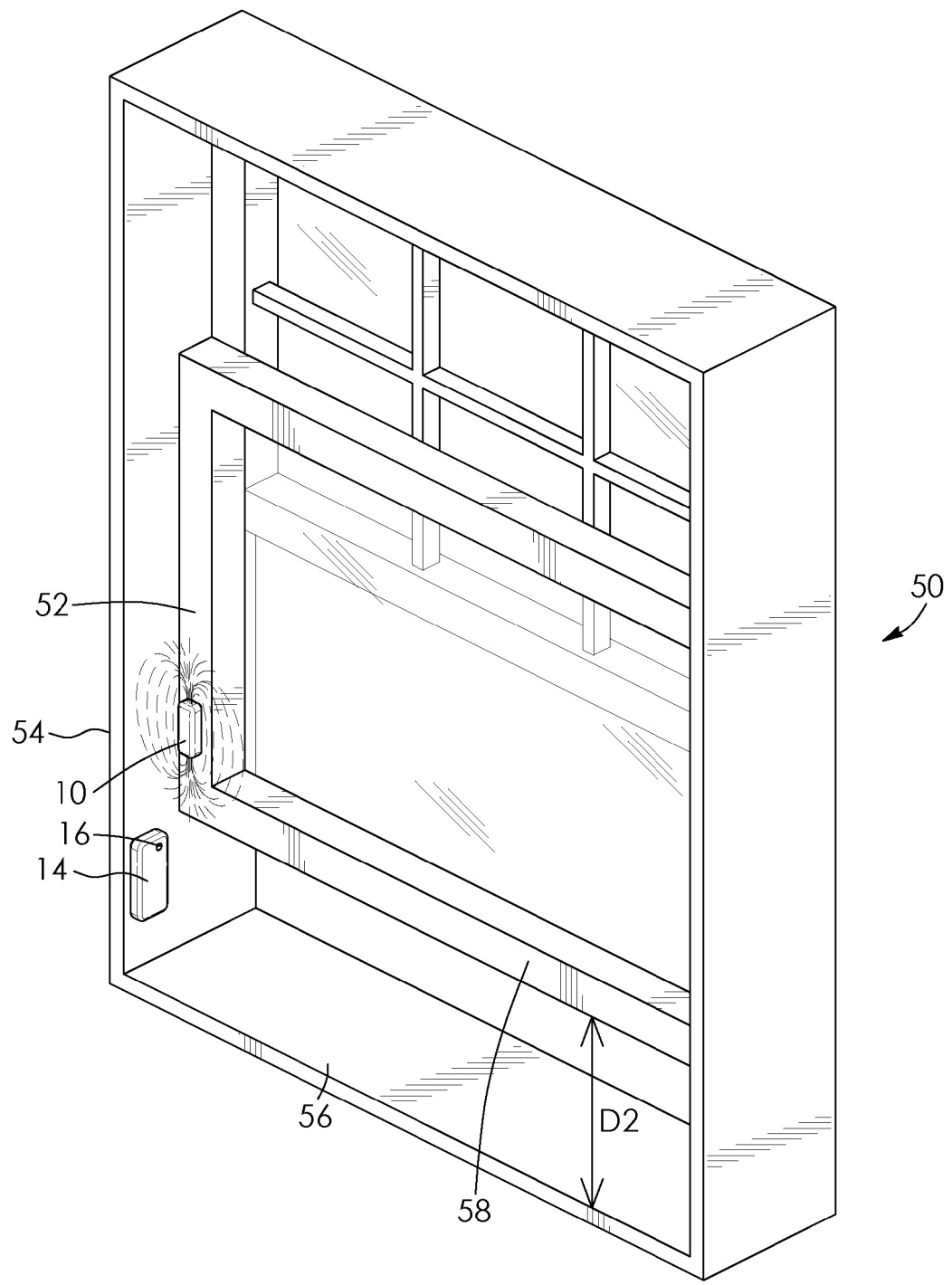
FIG. 15 is another perspective view showing the magnet and the magnetic field sensor of FIG. 1 being used as a window sensor in a security alarm system with the window opened a distance D2.
Figure 16:
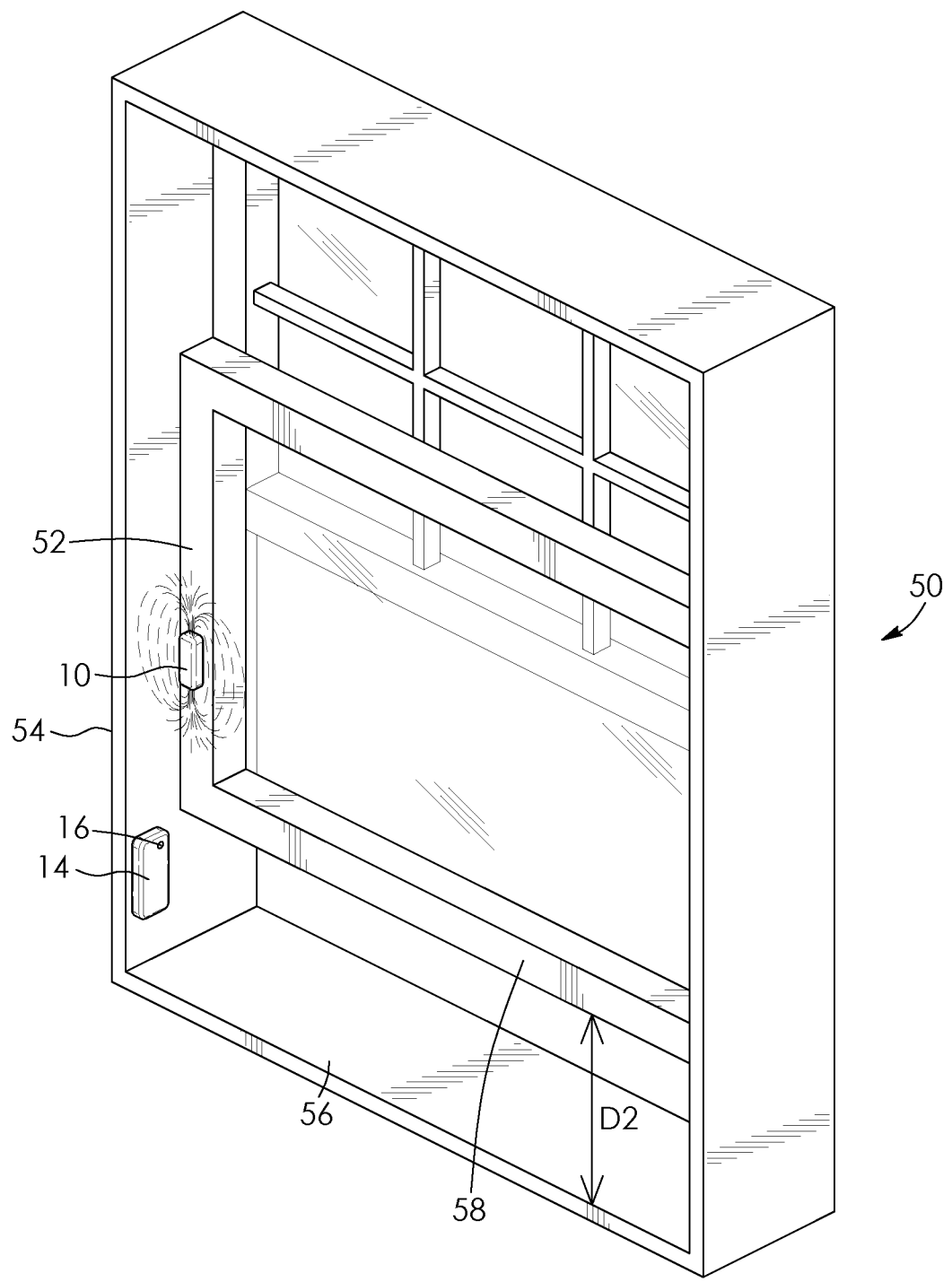
FIG. 16 is another perspective view showing the magnet and the magnetic field sensor of FIG. 1 being used as a window sensor in a security alarm system with the window opened a distance D2.
Figure 17:
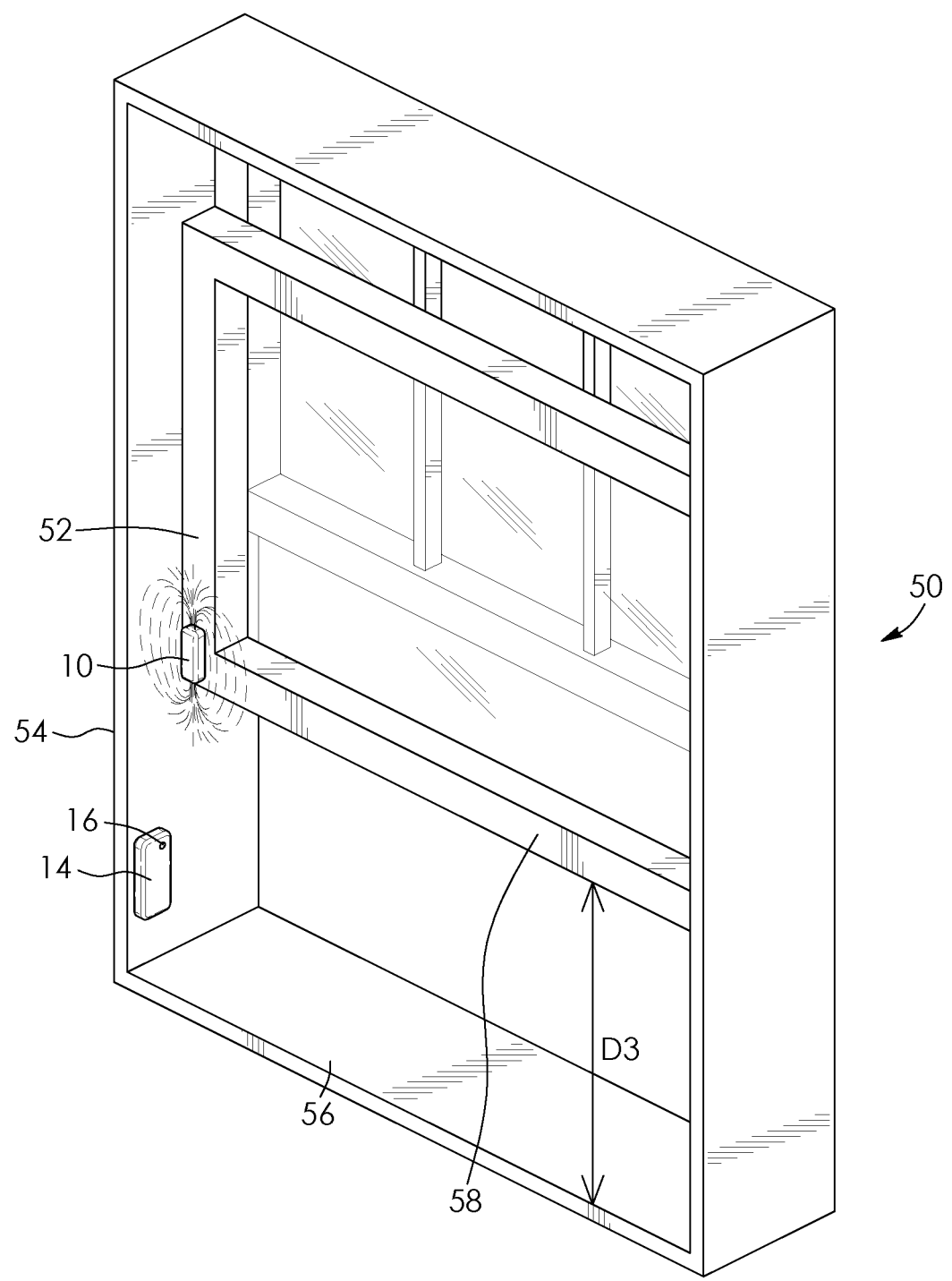
FIG. 17 is a perspective view showing the magnet and the magnetic field sensor of FIG. 1 being used as a window sensor in a security alarm system with the window opened a distance D3.

FIGS. 14 to 16 show where the magnet 10 may be positioned to avoid triggering an alarm when the window is opened a distance of D2 which is greater than D1. FIG. 14 shows that the magnetic field sensor 14 is able to sense a magnetic field generated by the magnet 10, as visually indicated by the indicator light 16 which is turned on, when the magnet 10 is mounted on the stile 52 adjacent to the bottom rail 58. FIG. 15 shows that the magnetic field sensor 14 is unable to sense the magnetic field generated by the magnet 10, as visually indicated by the indicator light 16 which is turned off, when the magnet 10 is mounted on the stile 52 away from the bottom rail 58. FIG. 16 shows that the magnetic field sensor 14 is also unable to sense the magnetic field generated by the magnet 10, as visually indicated by the indicator light 16 which is turned off, when the magnet 10 is mounted on the stile 52 further away from the bottom rail 58. The indicator light 16 accordingly provides a visual indication to an installer that the magnet 10 should be mounted on the stile 52 adjacent to the bottom rail 58, allowing the window 50 to be opened a distance of D2 without triggering an alarm. However, as shown in FIG. 17, opening the window a distance of D3 which is greater than D2 will trigger an alarm even if the magnet 10 is mounted on the stile 52 adjacent to the bottom rail 58. The indicator light 16 accordingly provides an installer with a visual indication to verify correct placement of the magnet 10 to allow a maximum threshold opening of the window 50. It will be understood by a person skilled in the art that mounting the magnet 10 on the stile 52 of the window 50 and mounting the magnetic field sensor 14 on the side jamb 54 of the window is only an example. The magnet 10 and the magnetic field sensor 14 may be mounted anywhere provided there is relative movement of the magnet 10 and the magnetic field sensor 14 when the window 50 is opened.

Figure 18:
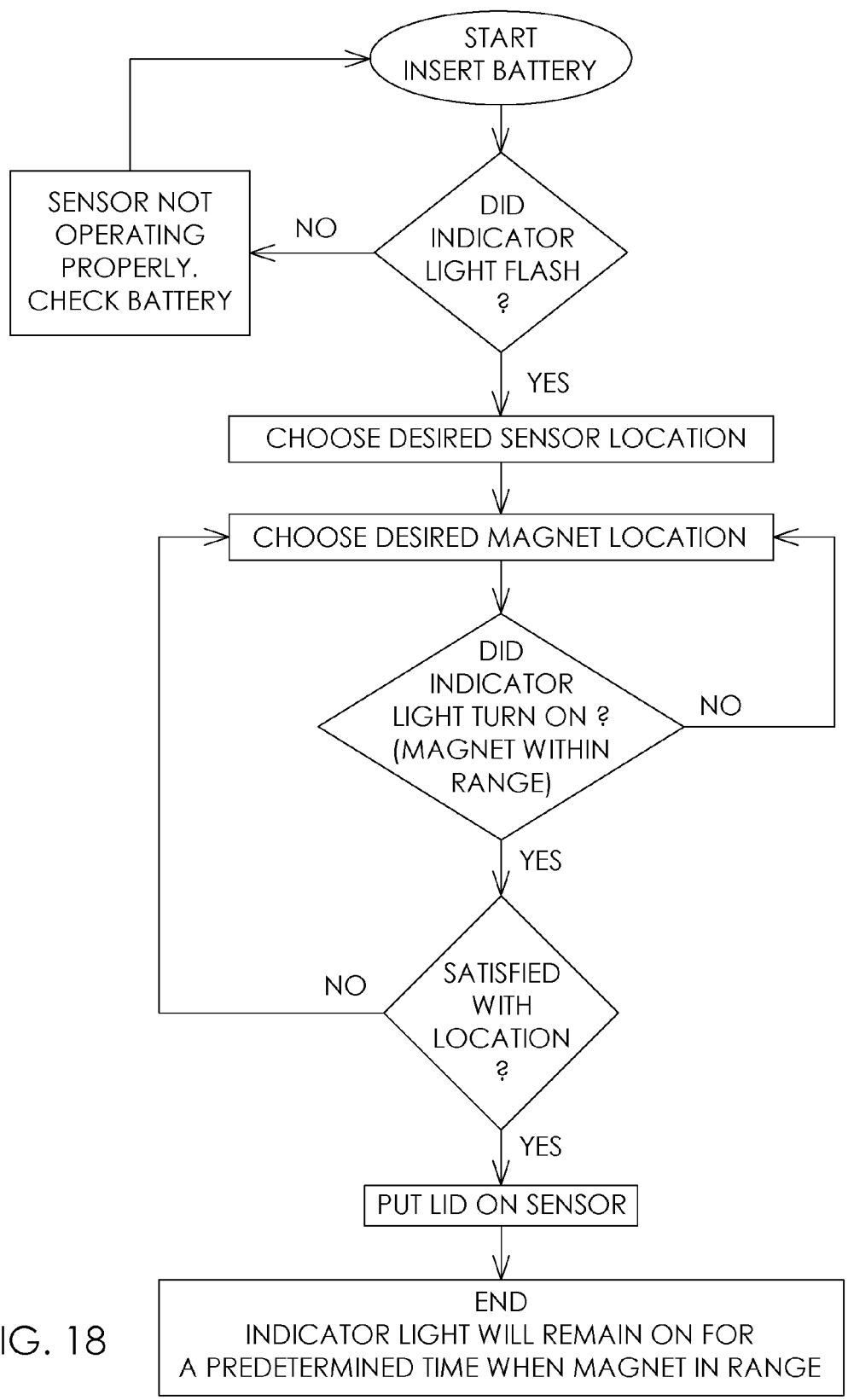
FIG. 18 is a flow chart showing the logic of installing the magnet and the magnetic field sensor relative to each other.

FIG. 18 is a flow chart showing the logic of installing the magnet 10 and magnetic field sensor 14 relative to each other. The coin cell battery 24 is first inserted into the magnetic field sensor 14 and the indicator light 16 flashes to indicate that the magnetic field sensor 14 has powered up and is functioning properly. If the indicator light 16 does not flash, then the magnetic field sensor 14 is not functioning properly and the coin cell battery 24 is removed and replaced. The magnetic field sensor 14 is next positioned in a desired location and the magnet 10 positioned in a desired location relative to the magnetic field sensor 14. The indicator light 16 will turn on when a magnetic field generated by the magnet 10 is sensed by the magnetic field sensor 14 and the indicator light 16 will turn off when a magnetic field generated by the magnet 10 is not sensed by the magnetic field sensor 14. The indicator light 16 accordingly assists an installer in determining proper relative positioning of the magnet 10 and magnetic field sensor 14. This allows the window 50 to be opened a certain distance without triggering the alarm. Once the installer is satisfied with the relative positioning of the magnet 10 and magnetic field sensor 14, the lid 19 of the magnetic field sensor 14 is closed. The indicator light 16 will then remain on for a predetermined period of time when a magnetic field generated by the magnet 10 is sensed by the magnetic field sensor 14.

The magnetic field sensor 14 is further provided with software having an algorithm which turns off the indicator light 16 after a predetermined period of time even if the magnetic field sensor 14 senses a magnetic field. This conserves the coin cell battery 24 of the magnetic field sensor 14 and does away with any visual annoyance resulting from the indicator light 16 being turned on when the window 50 is closed or opened less than a maximum threshold opening required to trigger an alarm. The magnetic field sensor 14 will however continue to otherwise operate normally and transmit a signal to trigger an alarm when the window 50 is opened and the magnetic field sensor 14 no longer senses a magnetic field generated by the magnet 10. The indicator light 16 is accordingly operable during installation of the window sensor and assists an installer in determining the relative positioning of the magnet 10 and magnetic field sensor 14 so as to allow the window 50 to be opened a certain distance without triggering the alarm. If an installer is unable to position the magnet 10 and magnetic field sensor 14 within the predetermined period of time before the software turns off the indicator light 16 then the lid 19 of the magnetic field sensor 14 can be removed to restart the algorithm. Replacing of the lid 19 will result in another predetermined period of time in which the indicator light 16 is operable to assist an installer in determining the relative positioning of the magnet 10 and magnetic field sensor 14 so as to allow the window 50 to be opened a certain distance without triggering the alarm.

Figure 19:
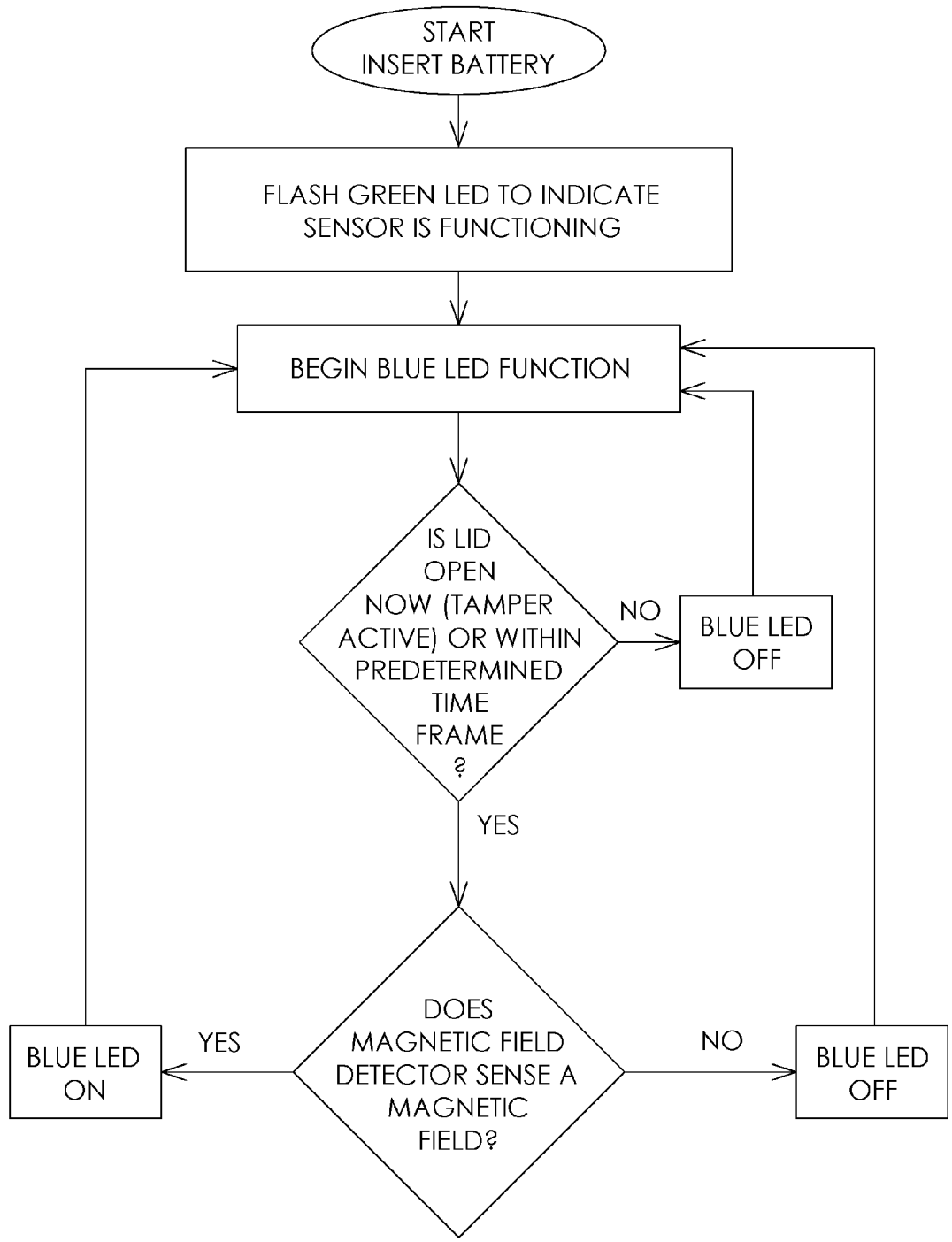
FIG. 19 is a flow chart showing the logic of a software algorithm which drives the magnetic field sensor.

FIG. 19 is a flow chart showing the logic of the algorithm. The coin cell battery 24 is first inserted into the magnetic field sensor 14 and the green light-emitting diode of the indicator light 16 turns on for a period of time, for example, five seconds. This indicates that the magnetic field sensor 14 has powered up and is functioning properly. The blue light-emitting diode of the indicator light 16 will then be operable. The magnet 10 and the magnetic field sensor 14 are next positioned relative to one another as shown in FIGS. 7 to 16. The blue light-emitting diode of the indicator light 16 will turn on when a magnetic field generated by the magnet 10 is sensed by the magnetic field sensor 14 and the blue light-emitting diode of the indicator light 16 will turn off when a magnetic field generated by the magnet 10 is not sensed by the magnetic field sensor 14. The indicator light 16 accordingly assists an installer in determining proper relative positioning of the magnet 10 and magnetic field sensor 14. Proper relative positioning of the magnet 10 and magnetic field sensor 14 may allow the window 50 to be opened a certain distance without triggering the alarm. If an installer is unable to position the magnet 10 and magnetic field sensor 14 within the predetermined period of time before the software turns off the indicator light 16 then the lid 19 can be removed to restart the algorithm as shown in FIG. 18. The red light-emitting diode of the indicator light 16 will flash when the coin cell battery 24 runs down below a predetermined low battery threshold. The frequency of the flashing will increase as the battery continues to run down.

The software may run other routines as set out below during operation of the magnetic field sensor 14.

Figure 20:
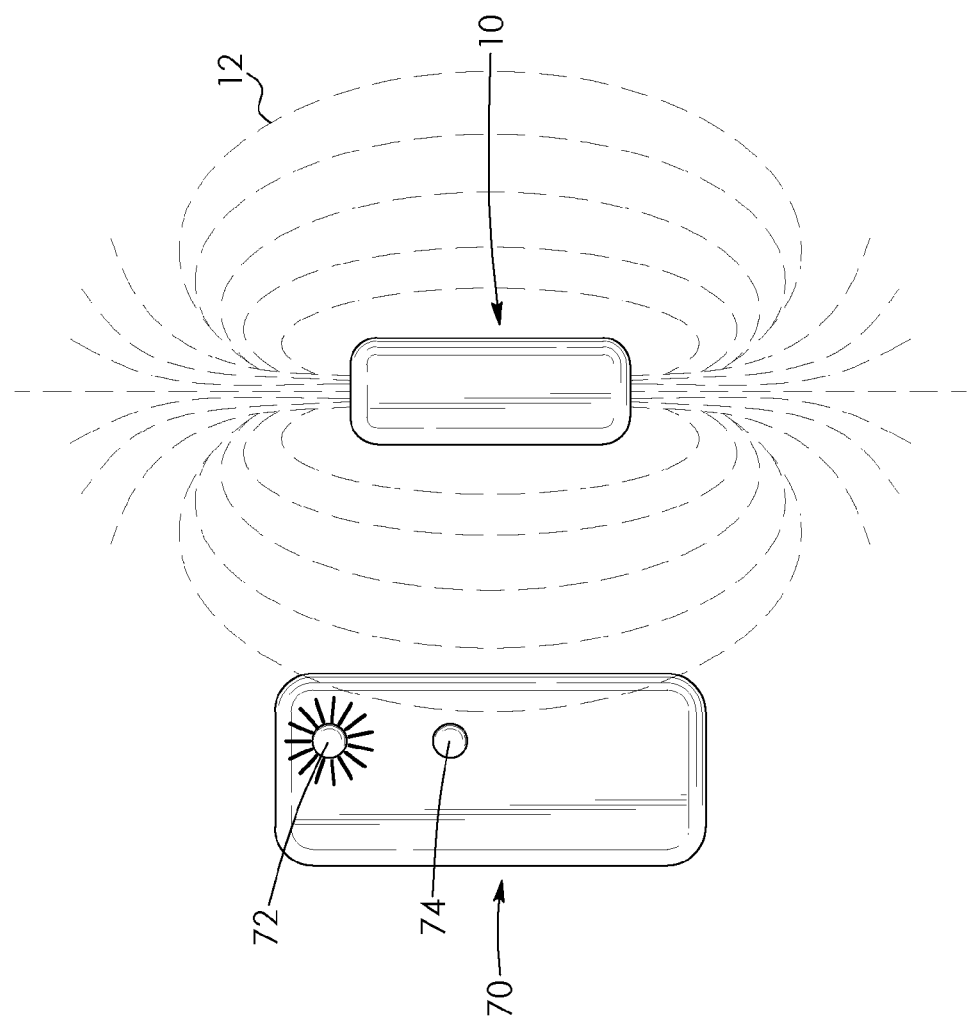
FIG. 20 is a perspective view of the magnet and a second magnetic field sensor.
Figure 21:
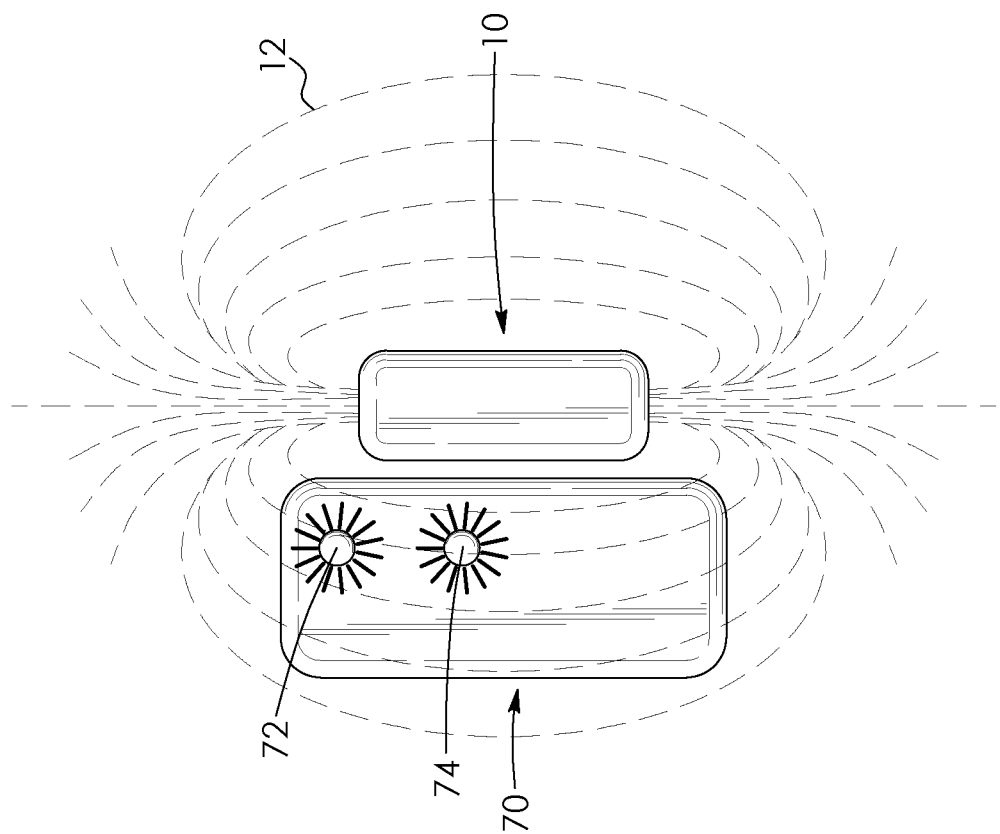
FIG. 21 is another perspective view of the magnet and the magnetic field sensor of FIG. 20.

Task 1:
   if tamper switch active (lid open) now or within past three minutes:
     if magnet is present:
       blue light-emitting diode ON
     else
       blue light-emitting diode OFF Task 2
   if magnet becomes present or magnet becomes absent:
     send magnet-change message
       if battery is failing
         blink red light-emitting diode
       else
         if tamper switch active (lid open) now or within past three minutes:
         blink green light-emitting diode Task 3:
   if approximately one hour has passed with no message sent:
     send supervisory message FIGS. 20 and 21 show a magnetic field sensor 70 which is substantially identical to the magnetic field sensor 14 shown in FIGS. 1 to 19 with the notable exception that the magnetic field sensor 70 has a first indicator light 72 and a second indicator light 74. The first indicator light 72 functions in a manner substantially identical to the indicator light 16 of the magnetic field sensor 14 shown in FIGS. 1 to 19. The first indicator light 72 accordingly provides a visual indication as to the presence or absence of a magnetic field. The second indicator light 74 provides a visual indication as to the strength of a magnetic field. The first indicator light 72 turns on when the magnetic field sensor 70 is within the magnetic field 12 generated by the magnet 10. However, as shown in FIG. 20, the second indicator light 74 does not turn on when the magnetic field sensor 70 is merely near a periphery of the magnetic field 12. The second indicator light 74 only turns on when the magnetic field sensor 70 is well within the magnetic field 12 as shown in FIG. 21. This allows an installer to see the best range for the relative positioning of the magnet 10 and magnetic field sensor 14. The second indicator light 74 is turned on by a microprocessor when a second, parallel device such as a reed switch senses a magnetic field.

Figure 22:
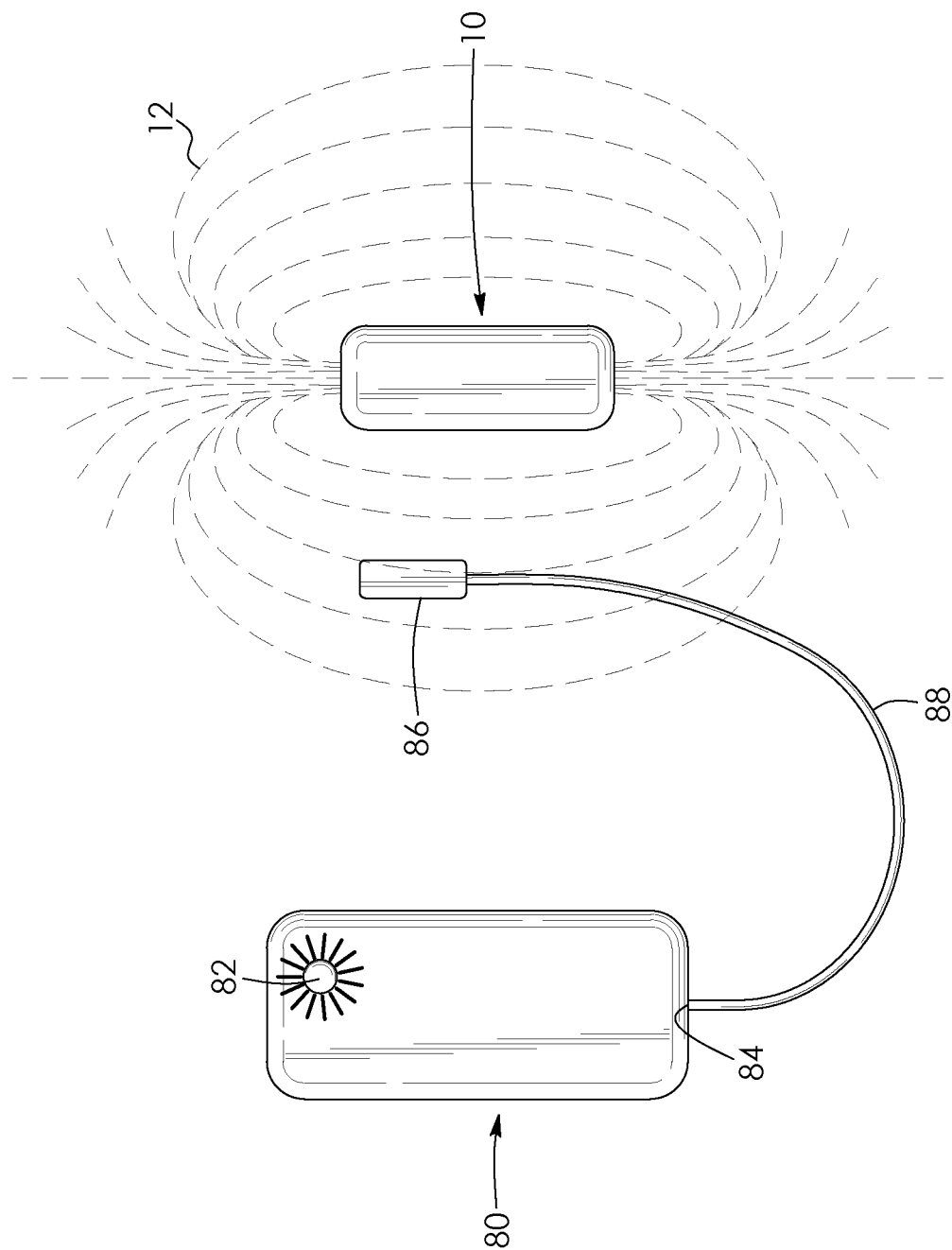
FIG. 22 is a perspective view of the magnet and a third magnetic field sensor.

FIG. 22 shows a magnetic field sensor 80 which is substantially identical to the magnetic field sensor 14 shown in FIGS. 1 to 19 with the notable exception that the magnetic field sensor 80 has a socket 84 for an additional dry contact. This allows another device, such as a reed switch 86, which senses the presence or absence of the magnetic field 12 generated by the magnet 10 to be coupled to the magnetic field sensor 80 by a tether 88. This increases the range of the magnetic field sensor 80 as the indicator light 82 will turn on when the reed switch 86 is within the magnetic field 12 even if the magnetic field sensor 80 is not within the magnetic field 12.

The examples shown in FIGS. 1 to 22 comprise a magnetic field sensor with an indicator in the form of an indicator light. However, it will be understood by a person skilled in the art that, in other examples, the indicator may be an auditory indicator which produces a sound to indicate the presence or absence of a magnetic field, or a vibratory indicator which vibrates to indicate the presence or absence of a magnetic field, or a combination of indicators selected from a visual indicator, an auditory indicator and a vibratory indicator. A switch may be used to select a desired indicator mode.

Figure 23:
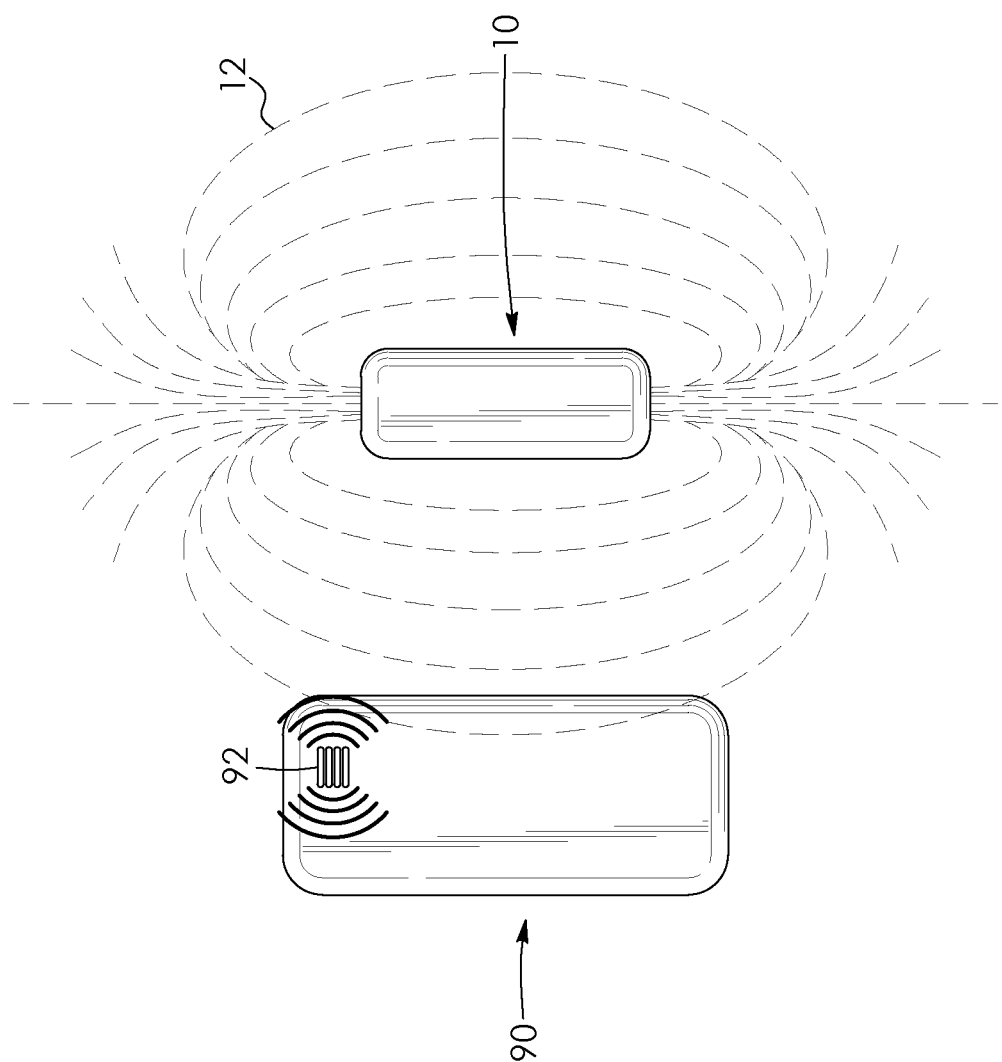
FIG. 23 is a perspective view of the magnet and a fourth magnetic field sensor.

FIG. 23 shows a magnetic field sensor 90 with an indicator in the form of an auditory indictor 92 that provides an auditory indication as to the presence or absence of a magnetic field. The auditory indicator 92 turns on and emits a sound when the magnetic field sensor 90 is within the magnetic field 12 generated by the magnet 10. This provides an auditory indication as to the presence of a magnetic field. However, after a predetermined period of time, the auditory indicator 92 will be turned off even in the presence of the magnetic field 12. This conserves power and does away with any auditory annoyance when the magnetic field sensor 90 is part of a proximity sensor in a security alarm system.

Figure 24:
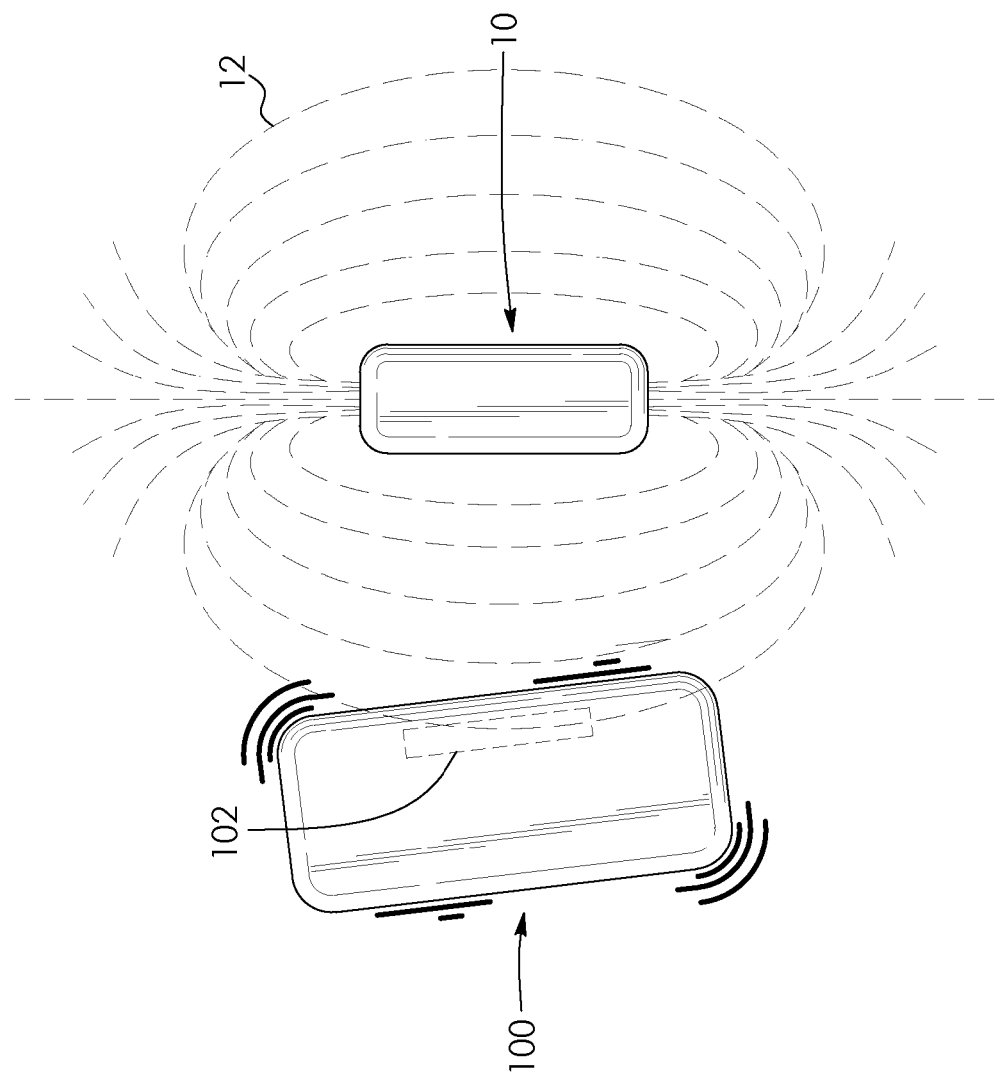
FIG. 24 is a perspective view of the magnet and a fifth magnetic field sensor.

FIG. 24 shows a magnetic field sensor 100 with an indicator in the form of a vibratory indictor 102 that provides a vibratory indication as to the presence or absence of a magnetic field. The vibratory indicator 102 turns on and vibrates when the magnetic field sensor 100 is within the magnetic field 12 generated by the magnet 10. This provides a vibratory indication as to the presence of a magnetic field. However, after a predetermined period of time, the vibratory indicator 102 will be turned off even in the presence of the magnetic field 12. This conserves power and does away with any vibratory annoyance when the magnetic field sensor 100 is part of a proximity sensor in a security alarm system.

It will be understood by a person skilled in the art that many of the details provided above are by way of example only, and are not intended to limit the scope of the invention which is to be determined with reference to the following claims.

What is claimed is:

1. A magnetic proximity sensor including a magnet which generates a magnetic field and a magnetic field sensor, the magnetic field sensor comprising:
    a radio and an antenna which transmit an output signal on a plurality of output frequencies;
    a microprocessor programmed with a plurality of data protocols, each of the output frequencies operating on at least one of the data protocols;
    a dip switch which is actuated to provide a code to the microprocessor, and one of the data protocols being implemented by the microprocessor based on the code; and
    a MEMS oscillator programmed to a discrete frequency based on the said one of the data protocols implemented by the microprocessor, wherein the MEMS oscillator provides the discrete frequency to the radio and the radio is provided with single phase-locked loop which generates the output signal based on the discrete frequency; and
    an indicator which turns on when a magnetic field generated by the magnet is sensed and turns off when a magnetic field generated by the magnet is not sensed, and wherein the microprocessor renders the indicator inoperable a predetermined period of time after the magnetic field sensor is powered up.

2. The magnetic field sensor as claimed in claim 1 further including a shunt at each terminal of the antenna.

3. The magnetic field sensor as claimed in claim 1 further including a circuit board and a housing with an opening:
    wherein the dip switch and the indicator are mounted on opposite sides of the circuit board; and
    wherein the circuit board is disposed in the housing with the dip switch being accessible though the opening.

4. The magnetic field sensor as claimed in claim 1 wherein the indicator is an auditory indicator.

5. The magnetic field sensor as claimed in claim 1 wherein the indicator is a vibratory indicator.

6. The magnetic field sensor as claimed in claim 1 wherein the indicator is a visual indicator.

7. The magnetic field sensor as claimed in claim 6 wherein the indicator comprises a light emitting diode.

8. The magnetic field sensor as claimed in claim 1 further including a coin cell battery as a power source.

9. The magnetic field sensor as claimed in claim 8 further including a supercapacitor connected in series with the coin cell battery.

10. The magnetic field sensor as claimed in claim 1 further including a tamper switch.

11. A security alarm system having a proximity sensor, the proximity sensor including a magnet which generates a magnetic field and a magnetic field sensor, the magnetic field sensor comprising:
    a radio and an antenna which transmit an output signal on a plurality of output frequencies;
    a microprocessor programmed with a plurality of data protocols, each of the output frequencies operating on at least one of the data protocols;
    a dip switch which is actuated to provide a code to the microprocessor, and one of the data protocols being implemented by the microprocessor based on the code; and
    a MEMS oscillator programmed to a discrete frequency based on the said one of the data protocols implemented by the microprocessor, wherein the MEMS oscillator provides the discrete frequency to the radio and the radio is provided with single phase-locked loop which generates the output signal based on the discrete frequency; and
    an indicator which turns on when a magnetic field generated by the magnet is sensed and turns off when a magnetic field generated by the magnet is not sensed, and wherein the microprocessor renders the indicator inoperable a predetermined period of time after the magnetic field sensor is powered up.

* * * * *